United States Patent
Ninomiya et al.

(10) Patent No.: US 9,000,506 B2
(45) Date of Patent: Apr. 7, 2015

(54) VARIABLE RESISTANCE NONVOLATILE MEMORY ELEMENT AND METHOD FOR MANUFACTURING THE SAME

(75) Inventors: Takeki Ninomiya, Osaka (JP); Takumi Mikawa, Shiga (JP); Yukio Hayakawa, Kyoto (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 139 days.

(21) Appl. No.: 13/501,624

(22) PCT Filed: Nov. 18, 2011

(86) PCT No.: PCT/JP2011/006451
§ 371 (c)(1),
(2), (4) Date: Apr. 12, 2012

(87) PCT Pub. No.: WO2012/066787
PCT Pub. Date: May 24, 2012

(65) Prior Publication Data
US 2013/0001504 A1    Jan. 3, 2013

(30) Foreign Application Priority Data
Nov. 19, 2010  (JP) ................. 2010-259555

(51) Int. Cl.
*H01L 27/108* (2006.01)
*H01L 45/00* (2006.01)
*H01L 27/24* (2006.01)

(52) U.S. Cl.
CPC .......... *H01L 45/146* (2013.01); *H01L 45/1233* (2013.01); *H01L 45/145* (2013.01); *H01L 45/08* (2013.01); *H01L 45/1675* (2013.01); *H01L 27/2463* (2013.01); *H01L 27/2481* (2013.01)

(58) Field of Classification Search
CPC .............. H01L 45/146; H01L 45/1675; H01L 27/2463; H01L 45/08; H01L 45/1233
USPC ............................ 257/306, 310; 438/396–399
See application file for complete search history.

(56) References Cited

U.S. PATENT DOCUMENTS

| | | | |
|---|---|---|---|
| 5,761,115 | A | 6/1998 | Kozicki et al. |
| 5,896,312 | A | 4/1999 | Kozicki et al. |

(Continued)

FOREIGN PATENT DOCUMENTS

| | | |
|---|---|---|
| JP | 2002-536840 | 10/2002 |
| JP | 2006-173267 | 6/2006 |

(Continued)

OTHER PUBLICATIONS

JP 2009-021524 to Akihiro, previously cited on IDS, English machine translation.*

(Continued)

*Primary Examiner* — Kevin Parendo
(74) *Attorney, Agent, or Firm* — Wenderoth, Lind & Ponack, L.L.P.

(57) ABSTRACT

A nonvolatile memory element which inhibits deterioration of an oxygen concentration profile of a variable resistance layer due to a thermal budget and is able to stably operate at low voltages, and a method for manufacturing the nonvolatile memory element are provided. The nonvolatile memory element includes a first electrode layer formed above a substrate, a variable resistance layer disposed on the first electrode layer, and a second electrode layer disposed on the variable resistance layer, and the variable resistance layer has a two-layer structure in which an oxygen- and/or nitrogen-deficient tantalum oxynitride layer and a tantalum oxide layer are stacked.

7 Claims, 13 Drawing Sheets

(56) References Cited

U.S. PATENT DOCUMENTS

| | | |
|---|---|---|
| 5,914,893 A | 6/1999 | Kozicki et al. |
| 6,084,796 A | 7/2000 | Kozicki et al. |
| 6,418,049 B1 | 7/2002 | Kozicki et al. |
| 6,469,364 B1 | 10/2002 | Kozicki |
| 6,474,766 B1 | 11/2002 | Cooper |
| 6,487,106 B1 | 11/2002 | Kozicki |
| 6,635,914 B2 | 10/2003 | Kozicki et al. |
| 6,798,692 B2 | 9/2004 | Kozicki et al. |
| 6,825,489 B2 | 11/2004 | Kozicki |
| 6,862,112 B2 | 3/2005 | Cooper |
| 6,865,117 B2 | 3/2005 | Kozicki |
| 6,914,802 B2 | 7/2005 | Kozicki |
| 6,927,411 B2 | 8/2005 | Kozicki |
| 6,940,745 B2 | 9/2005 | Kozicki |
| 6,985,378 B2 | 1/2006 | Kozicki |
| 6,998,312 B2 | 2/2006 | Kozicki et al. |
| 7,101,728 B2 | 9/2006 | Kozicki et al. |
| 7,142,450 B2 | 11/2006 | Kozicki et al. |
| 7,145,794 B2 | 12/2006 | Kozicki |
| 7,169,635 B2 | 1/2007 | Kozicki |
| 7,288,781 B2 | 10/2007 | Kozicki |
| 7,294,875 B2 | 11/2007 | Kozicki |
| 7,307,270 B2 | 12/2007 | Aratani et al. |
| 7,372,065 B2 | 5/2008 | Kozicki et al. |
| 7,385,219 B2 | 6/2008 | Kozicki et al. |
| 7,405,967 B2 | 7/2008 | Kozicki et al. |
| 7,560,722 B2 | 7/2009 | Kozicki |
| 7,675,766 B2 | 3/2010 | Kozicki |
| 7,728,322 B2 | 6/2010 | Kozicki |
| 7,929,331 B2 | 4/2011 | Kozicki |
| 7,989,924 B2 | 8/2011 | Sakamoto et al. |
| 8,022,384 B2 | 9/2011 | Kozicki |
| 8,022,502 B2 | 9/2011 | Kanzawa et al. |
| 2002/0121047 A1 | 9/2002 | Thrash |
| 2002/0158931 A1 | 10/2002 | Cooper |
| 2002/0159095 A1 | 10/2002 | Cooper |
| 2002/0168820 A1 | 11/2002 | Kozicki et al. |
| 2002/0190350 A1 | 12/2002 | Kozicki et al. |
| 2003/0035314 A1 | 2/2003 | Kozicki |
| 2003/0035315 A1 | 2/2003 | Kozicki |
| 2003/0048519 A1 | 3/2003 | Kozicki |
| 2003/0107105 A1 | 6/2003 | Kozicki |
| 2003/0137869 A1 | 7/2003 | Kozicki |
| 2003/0156447 A1 | 8/2003 | Kozicki |
| 2003/0209728 A1 | 11/2003 | Kozicki et al. |
| 2003/0209971 A1 | 11/2003 | Kozicki |
| 2004/0124407 A1 | 7/2004 | Kozicki et al. |
| 2004/0235204 A1 | 11/2004 | Kozicki |
| 2005/0111290 A1 | 5/2005 | Kozicki et al. |
| 2005/0226029 A1 | 10/2005 | Kozicki |
| 2005/0269566 A1 | 12/2005 | Kozicki |
| 2005/0274942 A1 | 12/2005 | Kozicki |
| 2005/0285096 A1 | 12/2005 | Kozicki |
| 2006/0118848 A1 | 6/2006 | Kozicki et al. |
| 2006/0126423 A1 | 6/2006 | Aratani et al. |
| 2006/0273429 A1 | 12/2006 | Sakamoto et al. |
| 2007/0139987 A1 | 6/2007 | Kouchiyama et al. |
| 2008/0001137 A1 | 1/2008 | Kozicki et al. |
| 2008/0006812 A1 | 1/2008 | Kozicki et al. |
| 2008/0237567 A1 | 10/2008 | Kozicki |
| 2008/0265285 A1 | 10/2008 | Kozicki |
| 2008/0272360 A1 | 11/2008 | Kozicki |
| 2009/0059651 A1 | 3/2009 | Aoki |
| 2009/0283736 A1 | 11/2009 | Kanzawa et al. |
| 2009/0283740 A1 | 11/2009 | Kozicki et al. |
| 2010/0135071 A1 | 6/2010 | Kozicki |
| 2010/0148143 A1* | 6/2010 | Fujii et al. .......... 257/5 |
| 2010/0308298 A1* | 12/2010 | Ninomiya et al. ........ 257/5 |
| 2011/0062408 A1 | 3/2011 | Kozicki |
| 2011/0194339 A1 | 8/2011 | Kozicki |
| 2011/0294259 A1 | 12/2011 | Kanzawa et al. |
| 2011/0315947 A1 | 12/2011 | Kozicki |
| 2012/0014165 A1 | 1/2012 | Kozicki |

FOREIGN PATENT DOCUMENTS

| | | |
|---|---|---|
| JP | 2006-319028 | 11/2006 |
| JP | 2007-157942 | 6/2007 |
| JP | 2008-177469 | 7/2008 |
| JP | 2008-288436 | 11/2008 |
| JP | 2009-21524 | 1/2009 |
| JP | 2009-218260 | 9/2009 |
| WO | 97/48032 | 12/1997 |
| WO | 99/28914 | 6/1999 |
| WO | 00/48196 | 8/2000 |
| WO | 02/21542 | 3/2002 |
| WO | 02/082452 | 10/2002 |
| WO | 02/099517 | 12/2002 |
| WO | 03/028098 | 4/2003 |
| WO | 03/032392 | 4/2003 |
| WO | 03/058638 | 7/2003 |
| WO | 03/079463 | 9/2003 |
| WO | 2005/124788 | 12/2005 |
| WO | 2007/132525 | 11/2007 |
| WO | 2008/146461 | 12/2008 |
| WO | 2008/149484 | 12/2008 |
| WO | 2009/157479 | 12/2009 |
| WO | 2010/038423 | 4/2010 |

OTHER PUBLICATIONS

"A Nonvolatile Programmable Solid-Electrolyte Nanometer Switch", IEEE Journal of Solid-State Circuits, vol. 40, No. 1, Jan. 2005, pp. 168-176.

Office Action with Search Report mailed May 30, 2014 in corresponding Chinese Application No. 201180004314.3, with English translation of Search Report.

* cited by examiner

VARIABLE RESISTANCE NONVOLATILE MEMORY ELEMENT AND METHOD FOR MANUFACTURING THE SAME

TECHNICAL FIELD

The present invention relates to a variable resistance nonvolatile memory element a resistance value of which reversibly changes by application of a voltage pulse, and a method for manufacturing the nonvolatile memory element.

BACKGROUND ART

In recent years, with advance in digital technology, electronic devices such as mobile information devices and information home appliances have been developed to provide higher functionality. As the electronic devices provide higher functionality, miniaturization and an increase in speed of semiconductor devices for use with the electronic devices are making rapid progress. Among them, the use of large capacity nonvolatile memory, represented by flash memory, is rapidly expanding. Furthermore, as a next-generation new nonvolatile memory replacing the flash memory, there is on-going research and development of nonvolatile memory elements using what is called a variable resistance element (for example, see WO2008/149484, WO2008/146461, and WO2010/38423). Here, the variable resistance element refers to an element which has a characteristic in which a resistance value reversibly changes depending on electric signals, and further is able to store information corresponding to the resistance value in a nonvolatile fashion.

WO2008/149484 discloses a variable resistance element using, as a variable resistance layer, a stack of tantalum oxide layers having different oxygen content percentages. The variable resistance element disclosed in WO2008/149484 is formed including a first electrode layer, a first variable resistance layer comprising a tantalum oxide $TaO_x$, a second variable resistance layer comprising a tantalum oxide $Ta_2O_5$, and a second electrode layer.

WO2008/146461 discloses a variable resistance element using the oxygen- and/or nitrogen-deficient tantalum oxynitride TaON for a variable resistance layer. The variable resistance element disclosed in WO2008/146461 includes a first electrode layer, a variable resistance layer (TaON) comprising an oxide that contains Ta and nitrogen, and a second electrode layer. WO2008/146461 discloses that a ratio of oxygen content percentage to nitrogen in the variable resistance layer (TaON) is, by way of example, equal to or greater than 1.08 and equal to or less than 1.35.

WO2010/38423 discloses a variable resistance element using a variable resistance layer having a three-layer structure in which a tantalum oxide $Ta_2O_5$, a tantalum oxynitride TaON, and the tantalum oxide $TaO_x$ are stacked in the stated order. In this structure, the tantalum oxynitride TaON is formed as a barrier layer to prevent introduction of oxygen into the tantalum oxide $TaO_x$.

As will be described, through intensive studies by the inventors of the present invention, there are findings that conventional variable resistance elements have problems that the resistance change characteristics may deteriorate depending on a thermal budget or the like, and the stable operation at low voltages is difficult.

SUMMARY OF THE INVENTION

To solve the above-mentioned problems, an object of the present invention is to provide a nonvolatile memory element which inhibits deterioration of an oxygen concentration profile of a variable resistance layer due to a thermal budget and is able to stably operate at low voltages, and a method for manufacturing the nonvolatile memory element.

To solve the above-mentioned problems, a nonvolatile memory element according to one embodiment of the present invention includes a first electrode layer formed above a substrate; a variable resistance layer disposed on the first electrode layer; and a second electrode layer disposed on the variable resistance layer. The variable resistance layer has a two-layer structure in which an oxygen- and/or nitrogen-deficient tantalum oxynitride layer and a tantalum oxide layer are stacked.

The oxygen- and/or nitrogen-deficient tantalum oxynitride material included in the oxygen- and/or nitrogen-deficient tantalum oxynitride layer refers to an oxide having a non-stoichiometric composition in which at least one of oxygen content and nitrogen content (atomic ratio: a ratio of the number of each of oxygen atoms and nitrogen atoms relative to the total number of atoms) is low as compared to an oxide having a stoichiometric composition (stoichiometric composition). That is, the oxygen- and/or nitrogen-deficient tantalum oxynitride material refers to materials having compositions satisfying $2x'+3y'<5$ when the compositions are represented by $TaO_{x'}N_{y'}$.

In the oxygen- and/or nitrogen-deficient tantalum oxynitride layer, oxygen hardly diffuses even when a thermal budget is given. According to the structure, using the oxygen- and/or nitrogen-deficient tantalum oxynitride layer as the variable resistance layer can inhibit oxygen from diffusing from the tantalum oxide layer to the oxygen- and/or nitrogen-deficient tantalum oxynitride layer. This allows inhibiting the deterioration of the oxygen concentration profile.

Moreover, preferably, the variable resistance layer: changes to a low resistance state due to oxygen ions moving from the tantalum oxide layer to the oxygen- and/or nitrogen-deficient tantalum oxynitride layer; and changes to a high resistance state due to oxygen ions moving from the oxygen- and/or nitrogen-deficient tantalum oxynitride layer to the tantalum oxide layer.

Moreover, preferably, when a composition of the oxygen- and/or nitrogen-deficient tantalum oxynitride layer is represented by $TaO_xN_y$, x and y satisfy:

$0.8 \leq x+y \leq 1.9$ and $0 < y \leq 0.5$ and when a composition of the tantalum oxide layer is represented by $TaO_z$, z satisfies:

$x+y < z$.

The resistance change operation occurs by the movement of oxygen (oxygen ions) in and out of the tantalum oxide layer by the application of the voltage pulse. The oxygen- and/or nitrogen-deficient tantalum oxynitride layer has effects in inhibiting diffusion of oxygen. However, if the nitrogen content in the oxygen- and/or nitrogen-deficient tantalum oxynitride layer is too high (namely, if the value of y is too high), the resistance change operation is inhibited. According to the structure, by setting the value of y of the oxygen- and/or nitrogen-deficient tantalum oxynitride layer having the composition represented by $TaO_xN_y$ so as to satisfy $0<y\leq0.5$, the deterioration of the oxygen concentration profile is inhibited and a favorable resistance change operation can be achieved.

Moreover, by setting the values of x and y of the oxygen- and/or nitrogen-deficient tantalum oxynitride layer (a composition: $TaO_xN_y$) so as to satisfy $0.8 \leq x+y \leq 1.9$ and setting the value of z the tantalum oxide layer (a composition: $TaO_z$) so as to satisfy $x+y<z$, the resistivity of the tantalum oxide layer becomes higher than the resistivity of the oxygen- and/or nitrogen-deficient tantalum oxynitride layer. The voltage pulse applied at the resistance change operation is distributed to the tantalum oxide layer and the oxygen- and/or nitrogen-deficient tantalum oxynitride layer. A voltage contributing to the resistance change operation is the voltage distributed to the tantalum oxide layer to/from which oxygen moves. By setting the resistivity of the tantalum oxide layer higher than the resistivity of the oxygen- and/or nitrogen-deficient tantalum oxynitride layer, a component of the voltage pulse distributed to the tantalum oxide layer increases. Thus the operation of the nonvolatile memory element at a low voltage is possible. By employing the above structure in the nonvolatile memory element, a voltage required to cause the nonvolatile memory element to perform the resistance change operation is equal to or smaller than 2.4 V. Thus, the operation of the nonvolatile memory element at a low voltage as compared to the conventional nonvolatile memory element is possible.

Moreover, preferably, a thickness of the oxygen- and/or nitrogen-deficient tantalum oxynitride layer is greater than a thickness of the tantalum oxide layer.

According to the above structure, by increasing the film thickness of the tantalum oxynitride layer to be greater than the thickness of the tantalum oxide layer, the deterioration of the oxygen concentration profile, which is a problem of the conventional variable resistance element, can be reduced.

Moreover, preferably, the oxygen- and/or nitrogen-deficient tantalum oxynitride layer has electrical conductivity.

Moreover, preferably, an electrode in contact with the tantalum oxide layer comprises one or more materials, each having a standard electrode potential higher than a standard electrode potential of tantalum.

Moreover, preferably, an electrode in contact with the oxygen- and/or nitrogen-deficient tantalum oxynitride layer comprises one or more materials, each having a standard electrode potential lower than a standard electrode potential of tantalum.

Moreover, preferably, the electrode in contact with the tantalum oxide layer comprises one or more materials from among Au, Pt, Ir, Pd, Cu, and Ag.

Moreover, preferably, the electrode in contact with the oxygen- and/or nitrogen-deficient tantalum oxynitride layer comprises one or more materials from among W, Ni, and TaN.

According to the above structure, the resistance change operation in the variable resistance layer can be caused only at an interface between the tantalum oxide layer and the electrode in contact therewith, and thus stable resistance change operation can be achieved.

Moreover, a method for manufacturing a nonvolatile memory element, including: forming, above a substrate, a first electrode material layer included in a first electrode layer; forming, on the first electrode material layer, an oxygen- and/or nitrogen-deficient tantalum oxynitride material layer included in an oxygen- and/or nitrogen-deficient tantalum oxynitride layer; forming, on the oxygen- and/or nitrogen-deficient tantalum oxynitride material layer, a tantalum oxide material layer included in a tantalum oxide layer; and forming, on the tantalum oxide material layer, a second electrode material layer included in a second electrode layer. In forming the oxygen- and/or nitrogen-deficient tantalum oxynitride material layer, the oxygen- and/or nitrogen-deficient tantalum oxynitride material layer is formed by a sputtering method.

According to the above structure, in forming the oxygen- and/or nitrogen-deficient tantalum oxynitride layer by the sputtering method, a reactive sputtering method can be used in which tantalum is used for a sputtering target, oxygen and nitrogen are used as the sputtering gas. This facilitates compositional control of the oxygen- and/or nitrogen-deficient tantalum oxynitride layer having a composition represented by $TaO_xN_y$ (where $0.8 \leq x+y \leq 1.9$ and $y \leq 0.5$).

Moreover, a method for manufacturing a nonvolatile memory element, including: forming, above a substrate, a second electrode material layer included in a second electrode layer; forming, on the second electrode material layer, a tantalum oxide material layer included in a tantalum oxide layer; forming, on the tantalum oxide material layer, an oxygen- and/or nitrogen-deficient tantalum oxynitride material layer included in an oxygen- and/or nitrogen-deficient tantalum oxynitride layer; and forming, on the oxygen- and/or nitrogen-deficient tantalum oxynitride material layer, a first electrode material layer included in a first electrode layer. In forming the oxygen- and/or nitrogen-deficient tantalum oxynitride material layer, the oxygen- and/or nitrogen-deficient tantalum oxynitride material layer is formed by a sputtering method.

According to the above structure, in forming the oxygen- and/or nitrogen-deficient tantalum oxynitride layer by the sputtering method, the compositional control of the oxygen- and/or nitrogen-deficient tantalum oxynitride layer having a composition represented by $TaO_xN_y$ (where $0.8 \leq x+y \leq 1.9$ and $y \leq 0.5$) is facilitated.

Moreover, according to the above structure, the tantalum oxide layer can be formed using a reactive sputtering method having a high deposition rate. In the above-described method for manufacturing the nonvolatile memory element, if the tantalum oxide material layer is formed by the reactive sputtering method, a surface of the oxygen- and/or nitrogen-deficient tantalum oxynitride material layer is exposed to oxygen plasma. Thus, the surface of the oxygen- and/or nitrogen-deficient tantalum oxynitride material layer ends up being oxidized, and a variable resistance layer having a desired oxygen concentration profile cannot be obtained. Due to this, the reactive sputtering method having a high deposition rate is used to prevent oxidation of the oxygen- and/or nitrogen-deficient tantalum oxynitride layer, allowing the tantalum oxide material layer to be formed. Thus, reduction in manufacturing cost is possible.

The present invention can provide a nonvolatile memory element which inhibits deterioration of the oxygen concentration profile of the variable resistance layer due to a thermal budget and is able to stably operate at low voltages, and a method for manufacturing the nonvolatile memory element.

DETAILED DESCRIPTION OF THE INVENTION

First, before describing embodiments of the present invention, the inventors' findings will be described. It should be noted that while the following description is intended as an aid in understanding the present invention, the following various experimental conditions and the like are not meant to limit the present invention.

Figure 13:
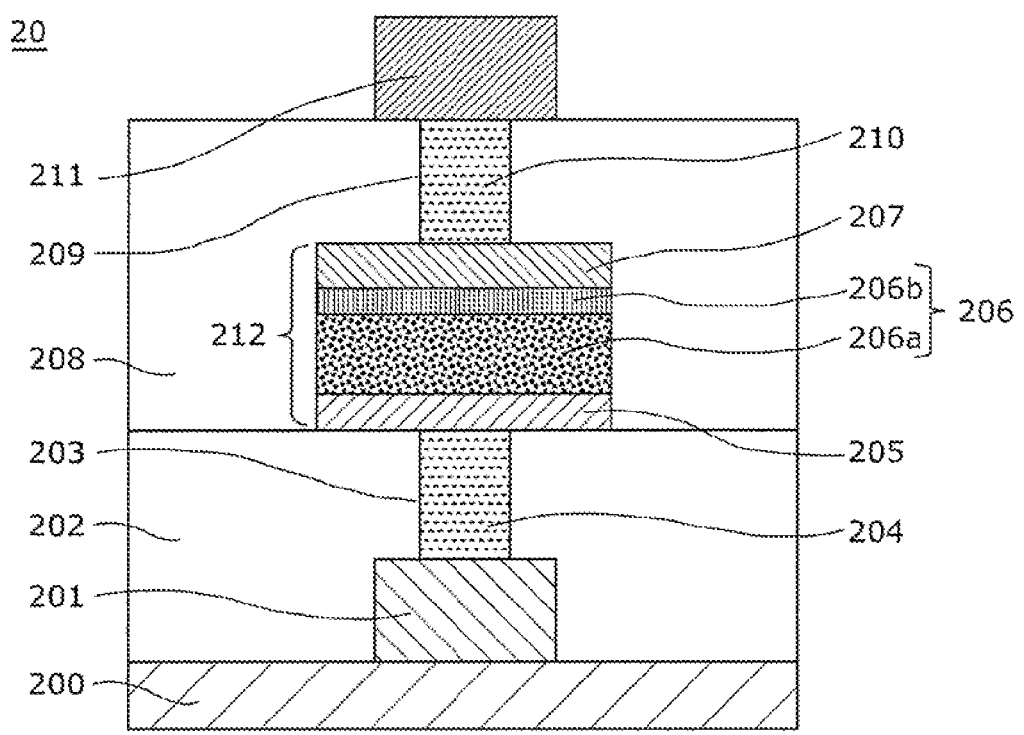
FIG. 13 is a cross-sectional view showing a schematic illustration of a nonvolatile memory element incorporating a variable resistance element described in WO2008/149484.

FIG. 13 is a cross-sectional view showing a schematic illustration of a nonvolatile memory element 20 incorporating a variable resistance element 212 described in WO2008/149484. As shown in FIG. 13, in the nonvolatile memory element 20, a substrate 200 having a first line 201 formed thereon, a first interlayer insulating layer 202 formed on the substrate 200, covering the first line 201, and a first contact hole 203 for electrically connecting between the first line 201 and a first electrode layer 205, extending through the first interlayer insulating layer 202 are formed. Inside the contact hole 203, a first contact plug 204 filled with tungsten as a principal component is formed.

The variable resistance element 212 which includes the first electrode layer 205, a variable resistance layer 206, and a second electrode layer 207 is formed on the first interlayer insulating layer 202 so as to cover the first contact plug 204.

Furthermore, a second interlayer insulating layer 208 is formed covering the variable resistance element 212, and a second contact hole 209 for electrically connecting between the second electrode layer 207 and a second line 211 is formed extending through the second interlayer insulating layer 208. Inside the second contact hole 209, a second contact plug 210 filled with tungsten as a principal component is formed. Furthermore, the second line 211 is formed on the second interlayer insulating layer 208 so as to cover the second contact plug 210.

The variable resistance layer 206 has a stacked structure including a first tantalum oxide layer 206a and a second tantalum oxide layer 206b. A first tantalum oxide material layer which is included in the first tantalum oxide layer 206a has a composition represented by $TaO_x$ satisfying $0.8 \leq x \leq 1.9$. A second tantalum oxide material layer which is included in the second tantalum oxide layer 206b has a composition represented by $TaO_z$ satisfying $2.1 \leq z < 2.5$.

In a process of manufacturing the nonvolatile memory element 20, the variable resistance element 212 is heat treated in forming a multi-layer line in such steps as of depositing an interlayer insulating layer, forming a contact plug, forming a line, and recovery annealing. The inventors' finding is that, due to the heat treatment, a thermal budget (thermal budget or thermal history) is given to the variable resistance element 212 and oxygen may diffuse from the second tantalum oxide layer 206b to the first tantalum oxide layer 206a.

Figure 14:
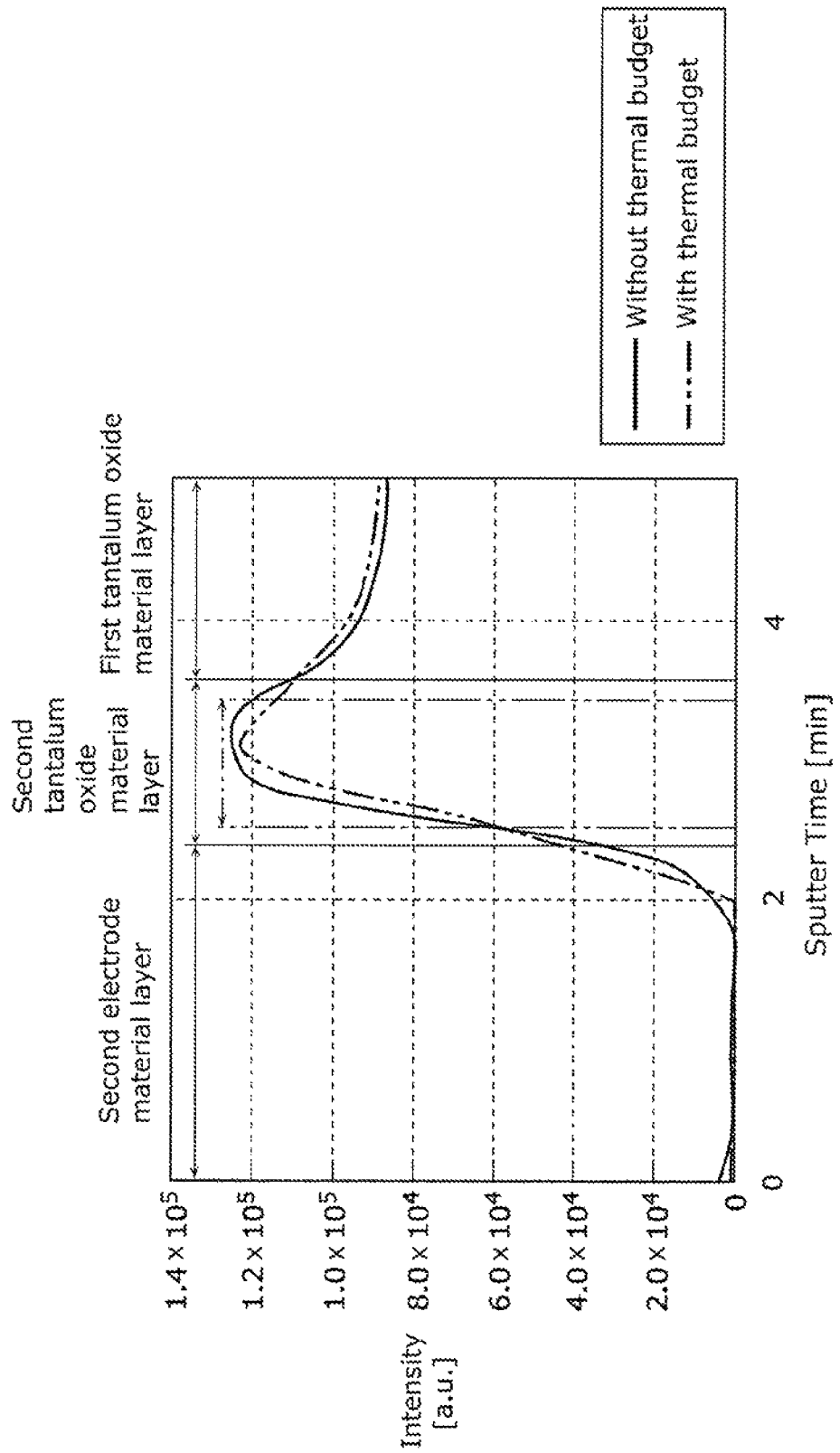
FIG. 14 is a diagram showing a result of analyzing an oxygen concentration profile of a stacked film which includes a first tantalum oxide material layer, a second tantalum oxide material layer, and the second electrode material layer, described in WO2008/149484 as shown in FIG. 13.

FIG. 14 is a diagram showing a result of analyzing oxygen concentration profiles (oxygen concentration distribution) in a direction of a film thickness by the Auger Electron Spectroscopy (AES) in a first tantalum oxide material layer represented by $TaO_x$ ($0.8 \leq x \leq 1.9$), a second tantalum oxide material layer having a composition represented by $TaO_z$ ($2.1 \leq z$), and a film in which Ir as the second electrode material layer is stacked on the second tantalum oxide material layer. FIG. 14 shows a sample (dashed like) to which the thermal budget is given and a sample (solid line) to which the thermal budget is not given, after the deposition of iridium as the second electrode material layer.

As can be seen from FIG. 14, by giving a thermal budget, the AES peak intensity in the second tantalum oxide material layer attenuates and the AES peak intensity in the first tantalum oxide material layer increases. That is, it can be determined that by giving a thermal budget, oxygen in the second tantalum oxide material layer diffuses to the first tantalum oxide material layer. A resistance value and the resistance change characteristics of the variable resistance element 212 depend on the film thickness and oxygen content of the second tantalum oxide material layer. As shown in FIG. 14, however, because oxygen diffuses from the second tantalum oxide layer 206b due to the given thermal budget, the oxygen content and the film thickness of the second tantalum oxide layer 206b reduce. To obtain a nonvolatile memory element having a desired resistance value and desired resistance change characteristics, deterioration of the oxygen concentration profile due to a thermal budget, namely, the diffusion of oxygen (oxygen ions) from regions having high oxygen concentration needs to be inhibited.

Figure 15:
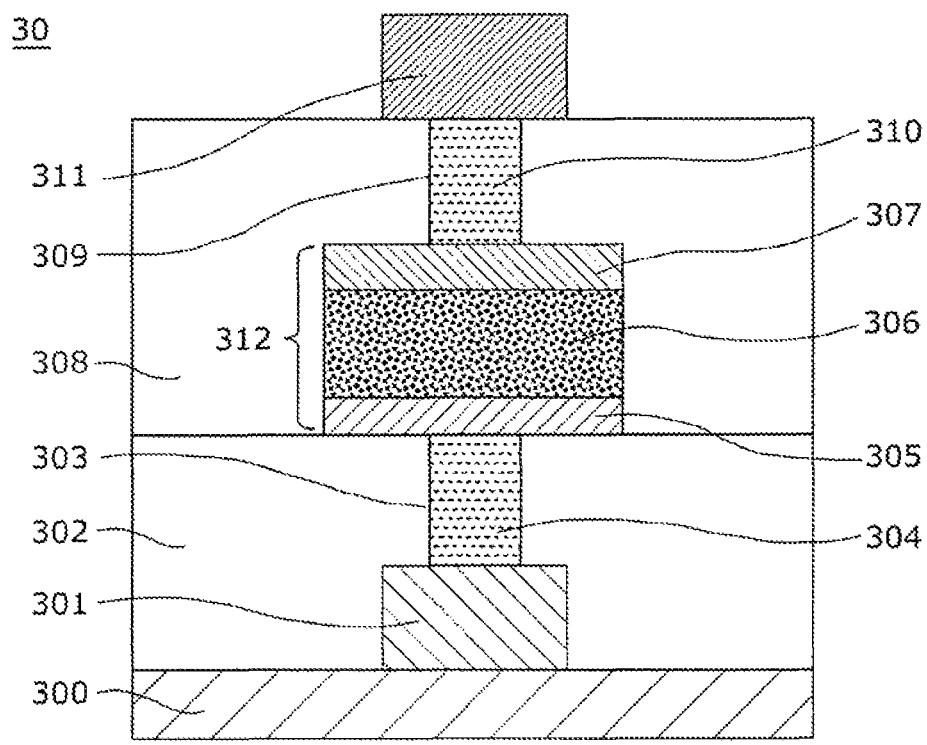
FIG. 15 is a cross-sectional view showing a schematic illustration of a nonvolatile memory element incorporating a variable resistance element described in WO2008/146461.

FIG. 15 is a cross-sectional view showing a schematic illustration of a nonvolatile memory element 30 incorporating a variable resistance element 312 described in WO2008/146461. As shown in FIG. 15, in the nonvolatile memory element 30, a substrate 300 having a first line 301 formed thereon, a first interlayer insulating layer 302 formed on the substrate 300, covering the first line 301, and a first contact hole 303 for electrically connecting between the first line 301 and the first electrode layer 305, extending through the first interlayer insulating layer 302, are formed. Inside the contact hole 303, a first contact plug 304 filled with tungsten as a principal component is formed. The variable resistance element 312 which includes the first electrode layer 305, a variable resistance layer 306, and the second electrode layer 307 is formed on the first interlayer insulating layer 302 so as to cover the first contact plug 304

Furthermore, a second interlayer insulating layer 308 is formed covering the variable resistance element 312, and a second contact hole 309 for electrically connecting between the second electrode layer 307 and a second line 311 is formed extending through the second interlayer insulating layer 308. Inside the second contact hole 309, a second contact plug 310 filled with tungsten as a principal component is formed. Furthermore, the second line 311 is formed on the second interlayer insulating layer 308 so as to cover the second contact plug 310.

The variable resistance layer 306 in the variable resistance element 312 includes an oxygen- and/or nitrogen-deficient tantalum oxynitride material layer. Oxygen content percentage to nitrogen in the oxygen- and/or nitrogen-deficient tantalum oxynitride layer is equal to or greater than 1.08 and equal to or less than 1.35. Through intensive studies by the inventors of the present invention, there are findings that oxygen in the oxygen- and/or nitrogen-deficient tantalum oxynitride layer hardly diffuses even when a thermal budget is given. That is, the inventors' view is that the deterioration of the oxygen concentration profile in the variable resistance layer due to the thermal budget can be inhibited by forming the variable resistance layer 306 from the oxygen- and/or nitrogen-deficient tantalum oxynitride material layer.

However, forming the variable resistance layer 306 from the oxygen- and/or nitrogen-deficient tantalum oxynitride material layer may inhibit the resistance change operation of the variable resistance layer 306. For example, in the variable resistance element 312 disclosed in WO2008/146461, a high pulse voltage as high as 3.0 V is applied to cause the resistance change operation.

Figure 16:
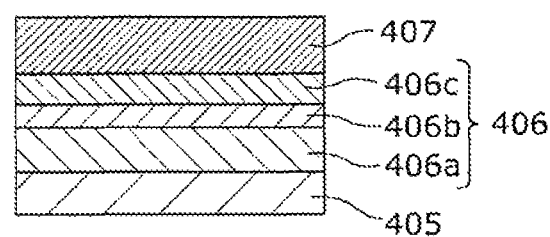
FIG. 16 is a cross-sectional view showing a schematic illustration of a nonvolatile memory element incorporating a variable resistance element described in WO2010/38423.
Figure 17:
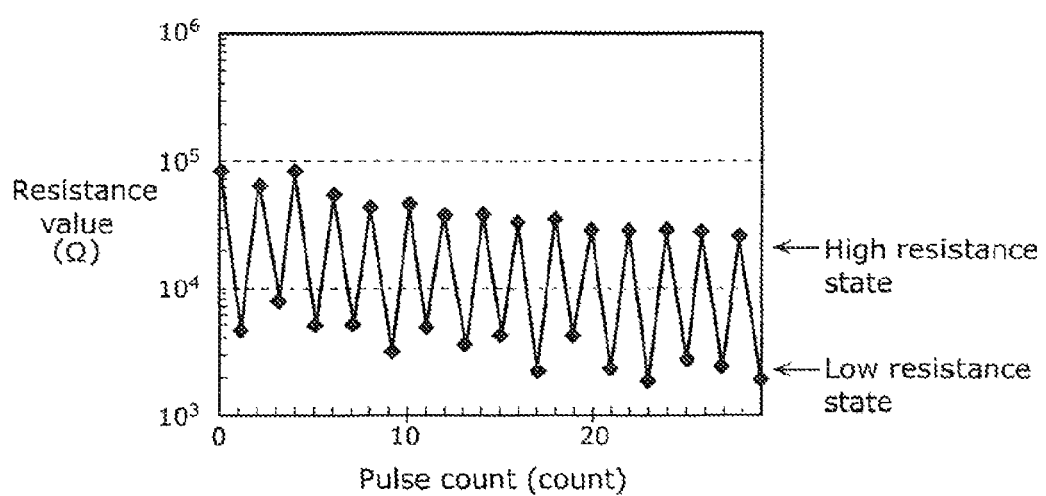
FIG. 17 is a diagram showing a resistance value characteristic of the variable resistance element described in WO2010/38423 as shown in FIG. 16.

FIG. 16 is a diagram showing a schematic illustration of a variable resistance element 412 described in WO2010/38423. FIG. 17 is a diagram showing the resistance value characteristic of the variable resistance element 412. As shown in FIG. 16, the variable resistance element 412 described in WO2010/38423 has a first electrode layer 405, a variable resistance layer 406, and a second electrode layer 407. The variable resistance layer 406 has a tantalum oxynitride layer (TaON) 406b between a tantalum oxide layer ($Ta_2O_5$) 406c and a tantalum oxide layer ($TaO_x$) 406a. By providing the tantalum oxynitride layer (TaON) 406b between the tantalum oxide layer ($Ta_2O_5$) 406c and the tantalum oxide layer ($TaO_x$) 406a, a resistance value of the variable resistance layer 406 at the resistance change varies as shown in FIG. 17. Therefore, further stabilization of the resistance value of the variable resistance element 412 at the resistance change, namely, further stabilization of the resistance change operation is desired.

Embodiments of the present invention described below are conceived based on the above studies, and can be implemented to provide a nonvolatile memory element which greatly inhibits the deterioration of oxygen concentration profile of the variable resistance layer due to a thermal budget and is able to stably operate at low voltages, and a method for manufacturing the nonvolatile memory element.

Hereinafter, the embodiments of the present invention will be described with accompanying drawings. It should be noted that the following embodiments of the present invention will be described with the accompanying drawings for illustration purposes only, and the present invention is not limited to the embodiments.

Embodiment 1

Structure of Nonvolatile Memory Element

Figure 1A:
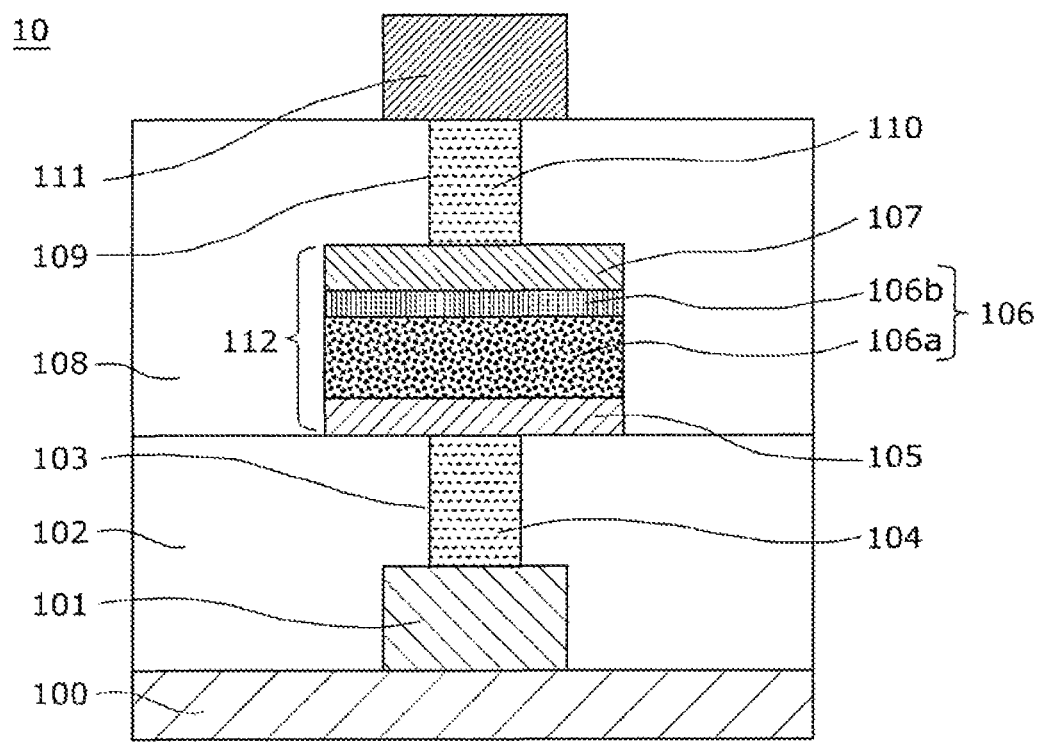
FIG. 1A is a cross-sectional view showing a schematic illustration of a nonvolatile memory element according to an embodiment 1 of the present invention.

FIG. 1A is a cross-sectional view showing a schematic illustration of a nonvolatile memory element 10 according to an embodiment 1 of the present invention.

As shown in FIG. 1A, the nonvolatile memory element 10 has a substrate 100, a first line 101 formed on the substrate 100, a first interlayer insulating layer 102, which comprises a silicon dioxide film and the like (500 nm to 1000 nm) and is formed on the substrate 100, covering the first line 101, a first contact hole 103 (diameter: 50 nm to 300 nm) formed extending through the first interlayer insulating layer 102, and a first contact plug 104 filled with tungsten as a principal component inside the first contact hole 103. A variable resistance element 112 is provided on the first interlayer insulating layer 102. A second interlayer insulating layer 108, which comprises a silicon dioxide film (thickness: 500 nm to 1000 nm), covering the variable resistance element 112 is formed. The nonvolatile memory element 10 has a second contact hole 109 (diameter: 50 nm to 300 nm) formed extending through the second interlayer insulating layer 108 and a second contact plug 110 which is filled with tungsten as a principal component inside the second contact hole 109. Furthermore, a second line 111 is formed on the second interlayer insulating layer 108, covering the second contact plug 110.

The variable resistance element 112 includes a first electrode layer 105 (thickness: 5 nm to 100 nm) which comprises a tantalum nitride or the like and is formed so as to cover the first contact plug 104, a variable resistance layer 106 (thickness: 20 nm to 100 nm), and a second electrode layer 107 (thickness: 5 nm to 100 nm) comprising a noble metal (such as Pt, Ir, Pd) or the like.

Here, as shown in FIG. 1A, the variable resistance layer 106 has a two-layer structure including an oxygen- and/or nitrogen-deficient tantalum oxynitride layer 106a formed on the first electrode layer 105 and a tantalum oxide layer 106b formed on the oxygen- and/or nitrogen-deficient tantalum oxynitride layer 106a.

The oxygen- and/or nitrogen-deficient tantalum oxynitride layer 106a has electrical conductivity and a characteristic that oxygen diffusion hardly occurs in the oxygen- and/or nitrogen-deficient tantalum oxynitride layer 106a as compared to the first tantalum oxide layer 206a described in WO2008/149484. Thus, disposing the oxygen- and/or nitrogen-deficient tantalum oxynitride layer 106a can inhibit diffusion of oxygen from the tantalum oxide layer 106b.

Moreover, a film thickness of the oxygen- and/or nitrogen-deficient tantalum oxynitride layer 106a is, by way of example, about 44.5 nm, and a film thickness of the tantalum oxide layer 106b is, by way of example, about 5.5 nm. That is, the thickness of the oxygen- and/or nitrogen-deficient tantalum oxynitride layer 106a is greater than the thickness of the tantalum oxide layer 106b. In the conventional variable resistance element 412 shown in WO2010/38423, the film thickness of the tantalum oxynitride layer 406b is about 3 nm to 5 nm and is smaller than that of the tantalum oxide layer 406a. In the variable resistance element 112, the film thickness of the oxygen- and/or nitrogen-deficient tantalum oxynitride layer 106a is greater than the thickness of the tantalum oxide layer 106b, thereby reducing the deterioration of the oxygen concentration profile which is a problem of the conventional variable resistance element.

Here, the film thickness of the oxygen- and/or nitrogen-deficient tantalum oxynitride layer 106a may at least be 15 nm. Preferably, the film thickness of the oxygen- and/or nitrogen-deficient tantalum oxynitride layer 106a is twice as great as the film thickness of the tantalum oxide layer 106b or greater.

Next, definition of the oxygen- and/or nitrogen-deficient tantalum oxynitride material will be described. The oxygen- and/or nitrogen-deficient tantalum oxynitride material refers to an oxynitride having a non-stoichiometric composition in which at least one of oxygen content and nitrogen content (atomic ratio: a ratio of the number of each of oxygen atoms and nitrogen atoms relative to the total number of atoms) is small as compared to an oxynitride having a stoichiometric composition. Generally, a composition of tantalum oxynitride material satisfies the following conditions, tantalum:oxygen:nitrogen=1:1:1. That is, the composition is in a stable state when tantalum is +5 valent ions, oxygen is −2 valent ions, and nitrogen is −3 valent ions. Thus, when representing the composition of tantalum oxynitride material by $TaO_{x'}N_{y'}$, a tantalum oxynitride material satisfying $2x'+3y'=5$ can exist stably. The oxygen- and/or nitrogen-deficient tantalum oxynitride material refers to a material having a composition thereof satisfying $2x'+3y'<5$ when the composition is represented by $TaO_{x'}N_{y'}$.

Moreover, when representing a composition of the oxygen- and/or nitrogen-deficient tantalum oxynitride layer 106a by $TaO_xN_y$, where Ta represents tantalum and O represents oxygen, a value of x and a value of y are within ranges of $0.8 \leq x+y \leq 1.9$ and $0 < y \leq 0.5$.

Next, the resistance change operation of the nonvolatile memory element 10 will be described.

If a stacked structure, including the oxygen- and/or nitrogen-deficient tantalum oxynitride layer 106a comprising the oxygen- and/or nitrogen-deficient tantalum oxynitride material and the tantalum oxide layer 106b comprising a tantalum oxide material having a high oxygen concentration, is employed as the variable resistance layer 106, initial resistance of the nonvolatile memory element 10 becomes extremely high due to the presence of the tantalum oxide layer 106b. Therefore, to obtain the resistance change characteristics, it is necessary to form a conductive path in the variable resistance layer 106 (cause breakdown) by applying, to the variable resistance layer 106 in the initial state, a voltage having a higher electric pulse (initial breakdown voltage) than a voltage typically used for resistance change. This processing is knows as initial breakdown.

In the initial breakdown, by applying the initial breakdown voltage to the variable resistance layer 106, a current is passed through the tantalum oxide layer 106b, which has a high oxygen concentration, of the variable resistance layer 106 to adjust the resistance value of the tantalum oxide layer 106b from an initial resistance value ($1 \times 10^6 \Omega$ to $1 \times 10^8 \Omega$), which is very high, to a resistance value ($1 \times 10^2 \Omega$ to $1 \times 10^4 \Omega$) which allows resistance change.

Here, a diameter of the conductive path formed by the initial breakdown is considered to be about 10 nm.

Through intensive studies by the inventors of the present invention, there are new findings that the formation of the conductive path by the initial breakdown process largely depends on the density of the current flowing through the variable resistance layer 106.

Thus, a problem arises that if effective element dimension and area through which the current flows in the variable resistance element 112 vary, the initial breakdown voltage whereby the conductive path is formed varies among a plurality of variable resistance elements 112.

That is, even if a predetermined initial breakdown voltage is applied, the density of the current flowing through each variable resistance element 112 varies, resulting that the initial breakdown is caused in some variable resistance elements 112 while the initial breakdown is not caused in some variable resistance elements 112. That is, reduction in initial breakdown rate reduces yield rate.

Furthermore, characteristics such as retention (data retention characteristics) and endurance (the number of times the data is rewritten) vary depending on the nonvolatile memory element 10. Due to this, an appropriate initial breakdown voltage cannot be set, ending up causing the yield rate of the nonvolatile memory element 10 to further reduce. Specifically, if the initial breakdown voltage is too high, the resistance value representing data "0" is lowered, and thus the resistance value cannot change to the high resistance state, representing data "1". Due to this, poor endurance, where rewriting is impossible, may occur. In contrast, if the initial breakdown voltage is too low, the resistance value indicating data "0" increases. Due to this, the resistance value moves to a high resistance state representing data "1" during data retention, and thus retention failure (data retention impossible), where data is rewritten, may occur.

As described above, the cause of the retention failure is that the density of the current flowing through each variable resistance element 112 at the initial breakdown, namely, the effective area of a cross section, of the variable resistance element 112, through which the current flows varies due to the variation in effective element dimension and area through which the current flows. This causes the yield rate of the nonvolatile memory element 10 to reduce and the deterioration in reliability to occur.

In the nonvolatile memory element 10 in which the initial breakdown is caused, the variable resistance element 112 changes between the low resistance state and the high resistance state by applying, to the second electrode layer 107, a positive or negative voltage pulse which is based on the first electrode layer 105. By the second electrode layer 107 having applied thereto a negative voltage pulse, the variable resistance element 112 is caused to change from the high resistance state to the low resistance state (change to low resistance state). By the second electrode layer 107 having applied thereto a positive voltage pulse, the variable resistance element 112 is caused to change from the low resistance state to the high resistance state (change to high resistance state).

Changing to the low resistance state is considered to occur when oxygen ions in the conductive path of the tantalum oxide layer 106b is expelled from the tantalum oxide layer 106b due to the negative pulse applied to the second electrode layer 107 and the oxygen content percentage in the conductive path of the tantalum oxide layer 106b reduces. Changing to the high resistance state, on the other hand, is considered to occur when oxygen ions in the oxygen- and/or nitrogen-deficient tantalum oxynitride layer 106a is taken into the conductive path of the tantalum oxide layer 106b due to the positive voltage pulse applied to the second electrode layer 107 and the oxygen content percentage in the conductive path in the tantalum oxide layer 106b increases.

Figure 1B:
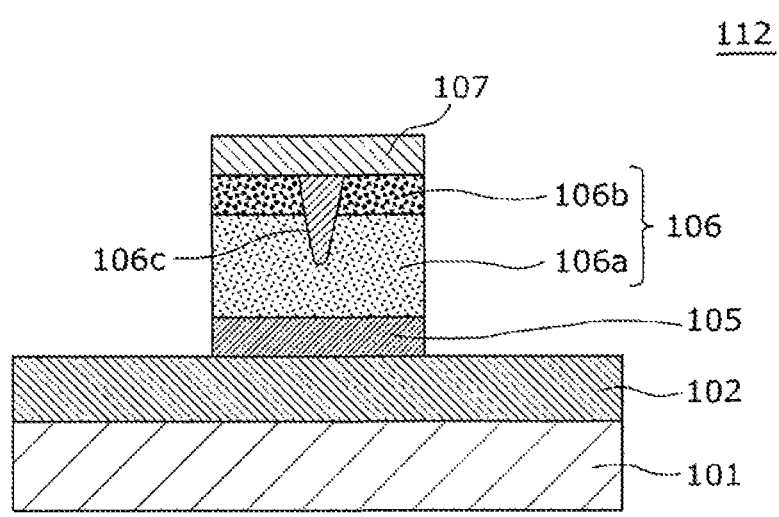
FIG. 1B is a diagram showing a structure of the variable resistance element in which a local region is formed by an initial breakdown.

More specific description is as follows. FIG. 1B is a diagram showing the structure of the variable resistance element 112 in which a local region 106c is formed by the initial breakdown.

The variable resistance layer 106 having the initial breakdown voltage applied thereto includes the local region 106c near an interface between the oxygen- and/or nitrogen-deficient tantalum oxynitride layer 106a which is a first oxide layer and the tantalum oxide layer 106b which is a second oxide layer. The degree of shortage of oxygen in the local region 106c is greater than the degree of shortage of oxygen in the tantalum oxide layer 106b and is different from the degree of shortage of oxygen in the oxygen- and/or nitrogen-deficient tantalum oxynitride layer 106a.

The local region 106c can be formed by applying the initial breakdown voltage to the variable resistance layer 106 having the stacked structure including the oxygen- and/or nitrogen-deficient tantalum oxynitride layer 106a and the tantalum oxide layer 106b. Preferably, the initial breakdown voltage is a low voltage. Due to the initial breakdown, the local region 106c is formed such that the local region 106c is in contact with the second electrode layer 107, extending through the tantalum oxide layer 106b and partially penetrating the oxygen- and/or nitrogen-deficient tantalum oxynitride layer 106a, and is not in contact with the first electrode layer 105.

Herein, the local region 106c means a region, in the variable resistance layer 106, through which a current dominantly flows when a voltage is applied between the first electrode layer 105 and the second electrode layer 107. The local region 106c also means a region which includes a set of a plurality of filaments (the conductive path) formed in the variable resistance layer 106. That is, the resistance change in the variable resistance layer 106 occurs through the local region 106c. Inference is made that the resistance change operation occurs by the density of oxygen deficiency in the local region 106c being changed due to oxidation-reduction. Thus, when a driving voltage is applied to the variable resistance layer 106 in the low resistance state, the current dominantly flows through the local region 106c which includes the filaments. The variable resistance layer 106 changes between the high resistance state and the low resistance state in the local region 106c.

In the variable resistance element 312 in WO2008/146461, a local region where the resistance change operation occurs in a tantalum oxynitride is formed, and thereby the resistance value of the variable resistance layer 306 changes between the high resistance state and the low resistance state.

Here, compositions of the oxygen- and/or nitrogen-deficient tantalum oxynitride layer 106a and the tantalum oxide layer 106b will be described. If a value obtained by x+y is smaller than 0.8, the resistance value of the variable resistance element 112 is low. Thus, a voltage is hardly applied to the variable resistance element 112, which requires an increase of the operating voltage. If the value obtained by x+y exceeds 1.9, the resistance value of the variable resistance element 112 is high. Thus, the operating voltage of the variable resistance element 112 rapidly increases. Therefore, if, for example, it is desired that the variable resistance element operates at equal to or less than 5 V, preferably, the value of x and the valued of y where the composition of the oxygen- and/or nitrogen-deficient tantalum oxynitride layer 106a is represented by $TaO_xN_y$, satisfy $0.8 \leq x+y \leq 1.9$. It can be seen that the variable resistance element 112 operates if the value of y satisfies $0 < y \leq 0.5$. For the variable resistance element 112 to stably operate, preferably, the value of y satisfies $0.22 < y \leq 0.5$.

Moreover, the composition, represented by $TaO_z$, of the tantalum oxide layer 106b is set so that the tantalum oxide layer 106b has a higher oxygen concentration than the oxygen- and/or nitrogen-deficient tantalum oxynitride layer 106a. Thus, a value of z satisfies $x+y<z$. It should be noted that the tantalum oxide layer 106b may not be of oxygen-deficient.

With the structure, the operating voltage of the variable resistance element 112 can be reduced and the variable resistance element 112 can operate at a low voltage as compared to the conventional variable resistance elements.

[Method for Manufacturing Nonvolatile Memory Element]

Figure 2:
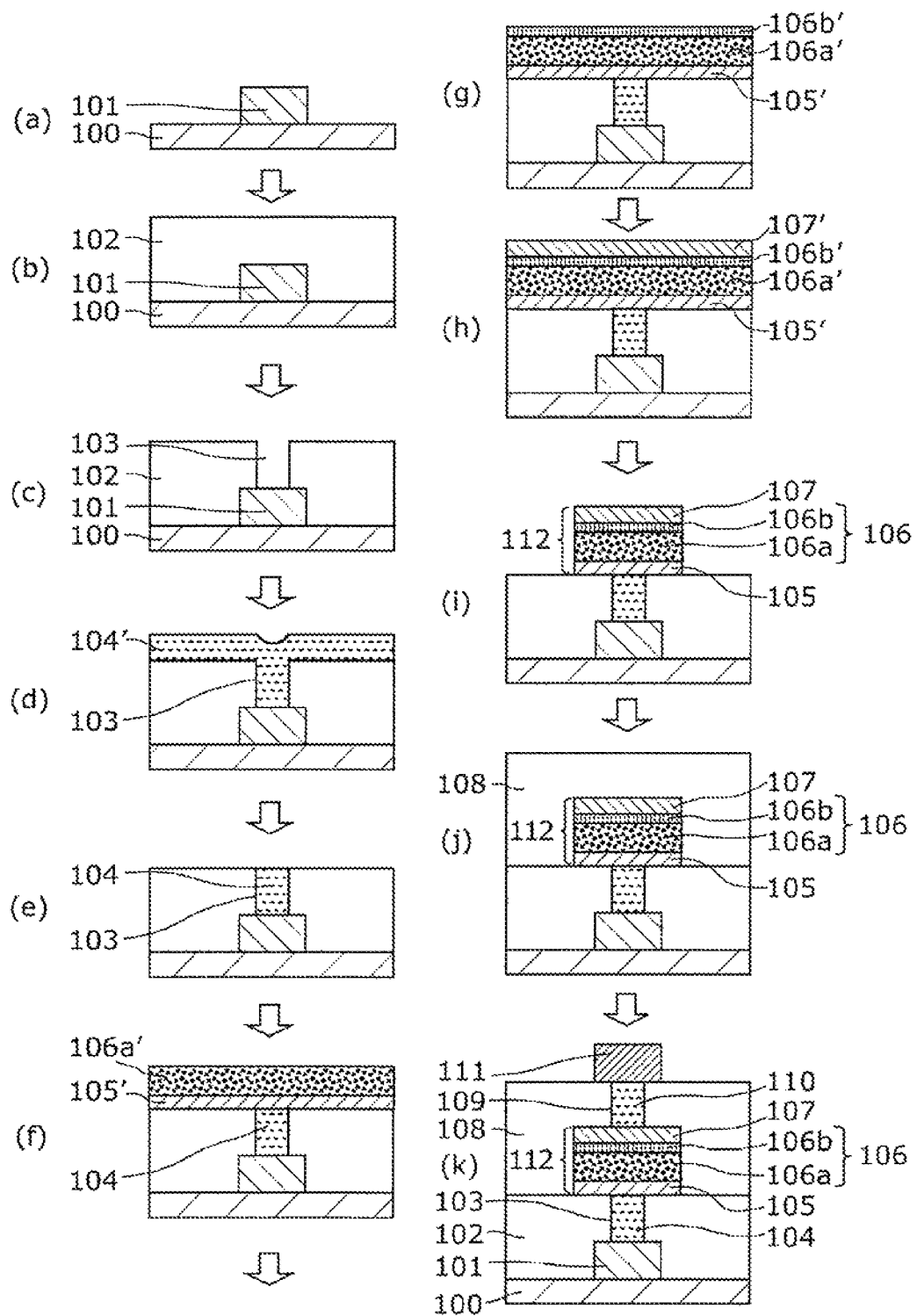
FIG. 2 is a cross-sectional view showing steps of a method for manufacturing the nonvolatile memory element according to the embodiment 1 of the present invention, wherein (a) is a diagram showing a step of forming a first line on a substrate, (b) is a diagram showing a step of forming a first interlayer insulating layer, (c) is a diagram showing a step of forming a first contact hole, (d) and (e) are diagrams showing a step of forming a first contact plug, (f) is a diagram showing a step of forming a first electrode material layer and an oxygen- and/or nitrogen-deficient tantalum oxynitride material layer, (g) is a diagram showing a step of forming a tantalum oxide material layer, (h) is a diagram showing a step of forming a second electrode material layer, (i) is a diagram showing a step of forming, by patterning using a mask and dry etching, a variable resistance element which includes the first electrode layer, the oxygen- and/or nitrogen-deficient tantalum oxynitride layer, the tantalum oxide layer, and the second electrode layer, (j) is a diagram showing a step of forming the second interlayer insulating layer, and (k) is a diagram showing a step of forming a second contact hole, a second contact plug, and a second line.

Parts (a) to (k) of FIG. 2 show cross-sectional views illustrating a method for manufacturing the nonvolatile memory element 10 according to the present embodiment. Using the figures, a method for manufacturing important part of the nonvolatile memory element 10 will be described.

As shown in (a) of FIG. 2, the first line 101 is formed on the substrate 100. On the substrate 100 on which a transistor, an underlying line, and the like are formed, a conductive layer (thickness: 400 nm to 600 nm) comprising aluminum or the like is formed by the sputtering method or the like. The obtained conductive layer is processed by patterning using a mask having a desired line pattern and dry etching to form the first line 101. It should be noted that the first line 101 may be formed using a manufacturing method such as damascene.

Next, as shown in (b) of FIG. 2, the first interlayer insulating layer 102 is formed. A plasma TEOS as an insulating layer is formed on the substrate 100 by the CVD method so as to cover the first line 101, and thereafter a surface of the plasma TEOS is planarized to form the first interlayer insulating layer 102 (thickness: 500 nm to 1000 nm). While the plasma TEOS is used for the first interlayer insulating layer 102, for reduction of parasitic capacitance between lines, a fluorine-containing oxide (for example, FSG) or a low-k material may be used.

Next, as shown in (c) of FIG. 2, the first contact hole 103 is formed. The first contact hole 103 (diameter: 50 nm to 300 nm) extending through the first interlayer insulating layer 102 is formed by patterning using a mask having a desired contact hole pattern and dry etching. Here, if the first line 101 has a smaller width than the first contact hole 103, an area in contact between the first line 101 and the first contact plug 104 changes due to misalignment of the mask, causing a change in, for example, a cell current. To prevent this, the first line 101 has an outline having a width greater than the first contact hole 103.

Next, as shown in (d) of FIG. 2, the first contact plug 104 to be connected to the first line 101 is formed. First, titanium (Ti) layer/titanium nitride (TiN) layer (thickness: 5 nm to 30 nm, each) each functioning as an adhesion layer and a diffusion barrier are deposited as a bottom layer by the sputtering method and the CVD method, respectively, and tungsten (W) (thickness: 200 nm to 400 nm), which is the principal component of the first contact plug 104, is deposited as a top layer by the CVD method. The first contact hole 103 is filled with a conductive layer 104' which has a stacked structure and is to be the first contact plug 104. The conductive layer 104' has the above-described W/Ti/TiN structure.

Next, as shown in (e) of FIG. 2, the first contact plug 104 is formed. After the above-described conductive layer 104' is formed, the planarization polishing is performed on the entire surface of the conductive layer 104' using the chemical mechanical polishing (CMP) to remove unnecessary portion of the conductive layer 104' on the first interlayer insulating layer 102, and the first contact plug 104 which has the conductive layer 104' left only inside the first contact hole 103 is formed.

Next, as shown in (f) of FIG. 2, a first electrode material layer 105' and an oxygen- and/or nitrogen-deficient tantalum oxynitride material layer 106a' are formed. The first electrode material layer 105' (thickness: 20 nm to 50 nm) comprising a tantalum nitride (TaN) is formed on the first interlayer insulating layer 102 by the sputtering method or the like, so as to cover the first contact plug 104.

Subsequently, the oxygen- and/or nitrogen-deficient tantalum oxynitride material layer 106a' is formed on the first electrode material layer 105' by the sputtering method. For the formation of the oxygen- and/or nitrogen-deficient tantalum oxynitride material layer 106a', a method what is called the reactive sputtering method is used in which, for example, a sputtering target comprising tantalum is sputtered in an atmosphere containing oxygen and nitrogen. The thickness of the oxygen- and/or nitrogen-deficient tantalum oxynitride material layer 106a' can be measured using the spectroscopic ellipsometry, and the thickness is, by way of example, 20 nm to 50 nm. Sputtering conditions upon formation of the oxygen- and/or nitrogen-deficient tantalum oxynitride material layer 106a' by the reactive sputtering method are, by way of example, that the power supply output is 1000 W, pressure of deposition is 0.05 Pa, argon, oxygen, and nitrogen are used as the sputtering gas, and flow rates of oxygen and nitrogen are controlled such that the resistivity of the oxygen- and/or nitrogen-deficient tantalum oxynitride material layer 106a' is 0.75 mΩ cm to 6 mΩ cm. Details of relationship between the deposition conditions and the resistivity of the oxygen- and/or nitrogen-deficient tantalum oxynitride material layer 106a' will be described below.

Next, as shown in (g) of FIG. 2, a tantalum oxide material layer 106b' is formed. The tantalum oxide material layer 106b' is formed on the oxygen- and/or nitrogen-deficient tantalum oxynitride material layer 106a'. For formation of the tantalum oxide material layer 106b', for example, a tantalum oxide having a composition represented by $Ta_2O_5$ is used as a sputtering target and the RF magnetron sputtering method which uses argon (Ar) as the sputtering gas is employed. Sputtering conditions are, by way of example, that the RF power supply output is 200 W, pressure of deposition is 0.3 Pa, argon gas flow rate is 300 sccm, and the substrate temperature is room temperature. A thickness, of the tantalum oxide material layer 106b' stacked under the oxygen- and/or nitrogen-deficient tantalum oxynitride material layer 106a', that is effective to cause resistance change is 3 nm to 10 nm, and the thickness can be measured using the spectroscopic ellipsometry. The deposition rate at which the tantalum oxide material layer 106b' is formed using the above-described sputtering conditions is, by way of example, 1.2 nm/minute.

Next, as shown in (h) of FIG. 2, a second electrode material layer 107' is formed. Iridium (Ir) as the second electrode material layer 107' is formed on the tantalum oxide material layer 106b' by, for example, the sputtering method. A thickness of the second electrode material layer 107' formed by the sputtering method is, by way of example, about 80 nm.

To achieve a stable resistance change operation of the variable resistance element 112, preferably, the first electrode material layer 105' in contact with the oxygen- and/or nitrogen-deficient tantalum oxynitride material layer 106a' comprises one or more materials, each having a standard electrode potential lower than the standard electrode potential of tantalum, such as W, Ni, and TaN. Also, preferably, the second electrode material layer 107' in contact with the tantalum oxide material layer 106b' comprises one or more materials, each having a standard electrode potential higher than the standard electrode potential of tantalum. Specifically, it is desired that the second electrode material layer 107' is formed by a noble metal such as Au (gold), Pt (platinum), Ir (iridium), Pd (palladium), Cu (copper), and Ag (silver). Generally, a noble metal is difficult to process but is relatively easy to process by disposing the second electrode material layer 107' on top of the variable resistance element 112. With such a structure, the resistance change operation in the variable resistance layer 106 can be caused only at an interface between the tantalum oxide layer 106b and the second electrode layer 107 in contact therewith. Therefore, the stable resistance change operation can be achieved.

Next, as shown in (i) of FIG. 2, the variable resistance element 112 is formed. The first electrode material layer 105', the oxygen- and/or nitrogen-deficient tantalum oxynitride material layer 106a', the tantalum oxide material layer 106b', and the second electrode material layer 107' are processed by patterning using a mask and dry etching to form the variable resistance element 112 having a stacked structure including the first electrode layer 105, the oxygen- and/or nitrogen-deficient tantalum oxynitride layer 106a, the tantalum oxide layer 106b, and the second electrode layer 107. A thickness of the second electrode layer 107 is about 50 nm to 60 nm.

Next, as shown in (j) of FIG. 2, the second interlayer insulating layer 108 (500 nm to 1000 nm) is formed covering the variable resistance element 112. After the formation of the second interlayer insulating layer 108, for purposes of relaxation of residual stress of the second interlayer insulating layer 108 and removal of residual water in the second interlayer insulating layer 108, the nonvolatile memory element 10 is heat treated for 10 minutes in a furnace heated at 400° C.

Last, as shown in (k) of FIG. 2, the second contact hole 109 and the second contact plug 110 are formed by the same manufacturing method as shown in (a) to (e) of FIG. 2. The second line 111 is thereafter formed covering the second contact plug 110. After the formation of the second line 111, for purposes of preventing corrosion of aluminum making up the second line 111, the nonvolatile memory element 10 is heat treated for 10 minutes in a furnace heated at 400° C. for the completion.

As described above, in the method for manufacturing the nonvolatile memory element 10 according to the present embodiment, the steps of (j) and (k) shown in FIG. 2 each include a step of heat treating the nonvolatile memory element 10 for 10 minutes in the furnace heated at 400° C. The heat treatment provides the variable resistance element 112 with a predetermined thermal budget.

[Resistivity of Oxygen- and/or Nitrogen-Deficient Tantalum Oxynitride Layer]

Next, relationship between deposition conditions and resistivity of the oxygen- and/or nitrogen-deficient tantalum oxynitride material layer 106a' will be described.

Figure 3:
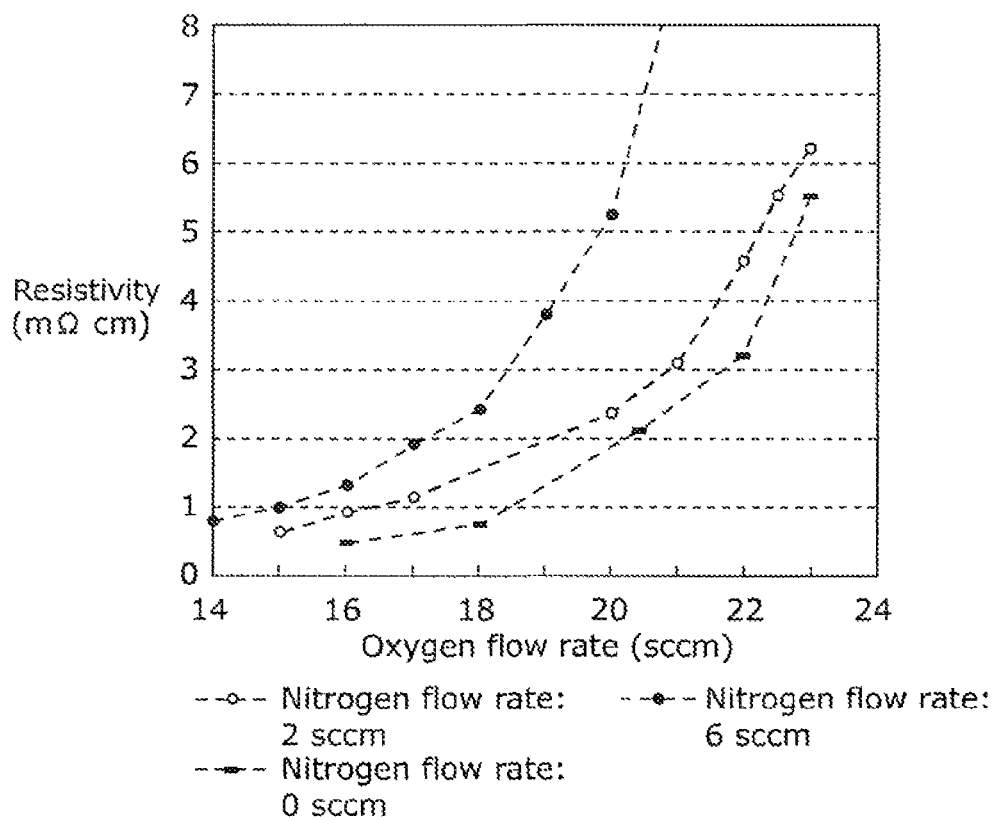
FIG. 3 is a diagram showing relationship between an oxygen flow rate, a nitrogen flow rate, and the resistivity, of the oxygen- and/or nitrogen-deficient tantalum oxynitride layer formed using the manufacturing method shown in (f) of FIG. 2.

FIG. 3 shows the relationship between the flow rates of oxygen and nitrogen and the resistivity of the oxygen- and/or nitrogen-deficient tantalum oxynitride material layer 106a' when the oxygen- and/or nitrogen-deficient tantalum oxynitride material layer 106a' having the composition represented by $TaO_xN_y$ is formed by the method as described in (f) of FIG. 2. FIG. 3 shows the resistivity of the oxygen- and/or nitrogen-deficient tantalum oxynitride material layer 106a' when the oxygen flow rate is changed when the nitrogen flow rate is 2 sccm and 6 sccm. For comparison, FIG. 3 also shows relationship between the resistivity and the oxygen flow rate when the nitrogen flow rate is 0 sccm, namely, when the tantalum oxynitride represented by $TaO_xN_y$ represents y=0.

The resistivity of the oxygen- and/or nitrogen-deficient tantalum oxynitride material layer 106a' is calculated based on results of measuring the film thickness by the spectroscopic ellipsometry and measuring the resistance value by the 4-terminal measurement method. The result shown in FIG. 3 indicates that the oxygen- and/or nitrogen-deficient tantalum oxynitride material layer 106a' has a higher resistivity when the nitrogen flow rate is 6 sccm than when the nitrogen flow rate is 2 sccm. That is, it can be seen that an increase of the nitrogen flow rate increases the resistivity of the oxygen- and/or nitrogen-deficient tantalum oxynitride material layer 106a'. This is because the increase of the nitrogen flow rate increases the nitrogen content in the oxygen- and/or nitrogen-deficient tantalum oxynitride material layer 106a' having the composition represented by $TaO_xN_y$ (that is, the value of y increases). Likewise, from the result shown in FIG. 3, it can be seen that an increase of the oxygen flow rate increases the resistivity of the oxygen- and/or nitrogen-deficient tantalum oxynitride material layer 106a'. This is because the increase of the oxygen flow rate increases the oxygen content in the oxygen- and/or nitrogen-deficient tantalum oxynitride material layer 106a' having the composition represented by $TaO_xN_y$ (that is, the value of x increases).

As described above, by changing the nitrogen flow rate and the oxygen flow rate by the reactive sputtering method described in (f) of FIG. 2, control of the nitrogen content and oxygen content in the oxygen- and/or nitrogen-deficient tantalum oxynitride material layer 106a' is possible.

[Composition of Oxygen- and/or Nitrogen-Deficient Tantalum Oxynitride Layer]

Next, the composition of the oxygen- and/or nitrogen-deficient tantalum oxynitride material layer 106a' will be described.

Table 1 shows a result of analyzing, by the Rutherford Backscattering Spectrometry (RBS), the values of x and y of the oxygen- and/or nitrogen-deficient tantalum oxynitride material layer 106a' which has the composition represented by $TaO_xN_y$ and is formed using the reactive sputtering method described in (f) of FIG. 2 so as to have the nitrogen flow rates of 2 sccm and 6 sccm. In the oxygen- and/or nitrogen-deficient tantalum oxynitride material layer 106a' shown in Table 1, the oxygen flow rate is adjusted so that the resistivity is approximately 2 mΩ cm. Table 1 also shows the oxygen flow rate in each case. For comparison, the value of x when the nitrogen flow rate is 0 sccm is also shown in Table 1.

The nitrogen content included in the oxygen- and/or nitrogen-deficient tantalum oxynitride material layer 106a' formed using the method described in (f) of FIG. 2 is considered as being dependent on the nitrogen flow rate in forming the oxygen- and/or nitrogen-deficient tantalum oxynitride material layer 106a' using the reactive sputtering method. Therefore, from the result shown in Table 1, the value of y of the oxygen- and/or nitrogen-deficient tantalum oxynitride material layer 106a' that is formed when the nitrogen flow rate is 2 sccm is 0.22, and the value of y of the oxygen- and/or nitrogen-deficient tantalum oxynitride material layer 106a' that is formed when the nitrogen flow rate is 6 sccm is 0.4.

The compositions of oxygen and nitrogen analyzed by the RBS method each include a relatively large error of ±4% in atm % unit. Because of this, error also occurs in the values of x and y. In view of errors as a result of the RBS method, the value of y when the nitrogen flow rate is 6 sccm in Table 1 is within a range of $0.30 \leq y \leq 0.50$. Therefore, a maximum value of the value of y of the oxygen- and/or nitrogen-deficient tantalum oxynitride having the composition represented by $TaO_xN_y$, which is shown in Table 1, is 0.5.

[Table 1]

TABLE 1

| nitrogen flow | oxygen flow | resistivity | value of x | value of y | value of x + y |
|---|---|---|---|---|---|
| 0 sccm | 20.4 sccm | 2.0 mΩ cm | 1.4 | 0 | 1.4 |
| 2 sccm | 20 sccm | 2.1 mΩ cm | 1.2 | 0.22 | 1.4 |
| 6 sccm | 17 sccm | 1.9 mΩ cm | 1.1 | 0.4 | 1.5 |

[Resistivity and Composition of Tantalum Oxide Layer]

Next, the resistivity and a composition of the tantalum oxide material layer 106b' will be described. The magnitude of the initial resistance value of the variable resistance element 112 depends on the value of z when the composition of the tantalum oxide material layer 106b' is represented by $TaO_z$.

First, the tantalum oxide material layer 106b' having a film thickness of 50 nm is formed using the same conditions as for the method described in (g) of FIG. 2, and an attempt is made to measure the sheet resistance (sheet resistance) of the tantalum oxide material layer 106b' by the 4-terminal measurement method. The sheet resistance, however, exceeds a measurable sheet resistance ($10^7$ Ω/sq.), thus cannot be measured. Therefore, the resistivity of the tantalum oxide material layer 106b' in the present embodiment is at least equal to or greater than 50000 mΩ cm.

Figure 4:
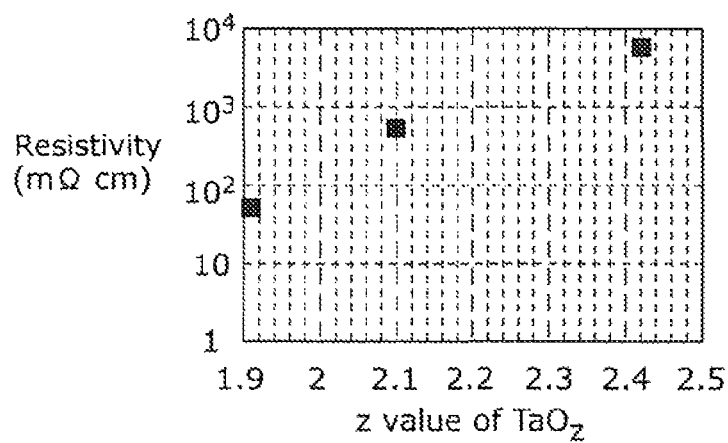
FIG. 4 is a diagram showing relationship between a value of z and the resistivity of the tantalum oxide material layer having a composition represented by $TaO_z$.

FIG. 4 shows relationship between the resistivity of the tantalum oxide material layer 106b' having the composition represented by $TaO_z$ and the value of z measured by the RBS method. The resistivity of the tantalum oxide material layer 106b' is calculated based on the film thickness measured by the spectroscopic ellipsometry and the sheet resistance measured by the 4-terminal measurement method. It can be seen from FIG. 4 that as the value of z increases, the resistivity of the tantalum oxide material layer 106b' increases. In addition, the measurement by the 4-terminal measurement method is possible when z=2.42 and the resistivity is 5300 mΩ cm. Therefore, when the composition of the tantalum oxide material layer 106b' formed by the method described in (g) of FIG. 2 is represented by $TaO_z$ in a range of measurable resistivity, the value of z is within a range of 2.42<z.

Figure 5:
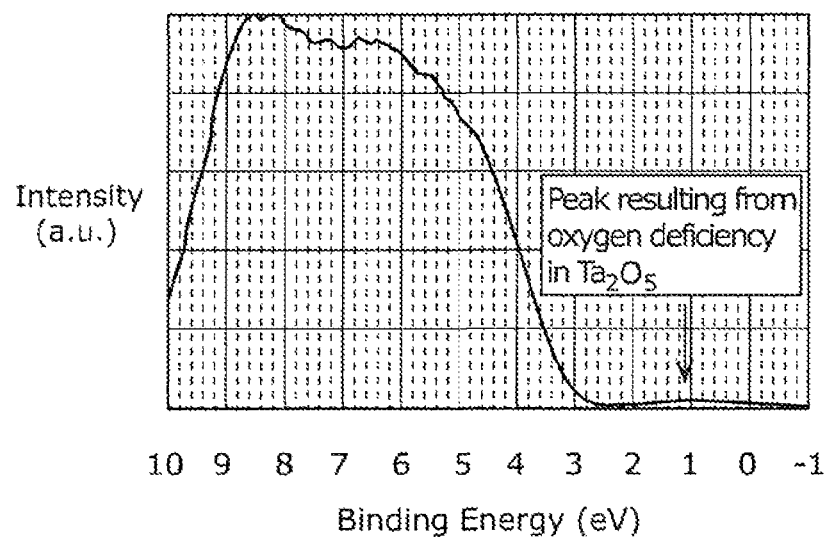
FIG. 5 is a diagram showing a result of measuring a valence band electronic state of the tantalum oxide material layer by the XPS method.

FIG. 5 shows a result of measuring a valence band electronic state of the tantalum oxide material layer 106b' by the XPS method. From the result of measuring by the XPS method shown in FIG. 5, a peak resulting from a reducing component of the tantalum oxide having the composition represented by $Ta_2O_5$ (namely, resulting from oxygen deficiency of $Ta_2O_5$) is confirmed in the tantalum oxide material layer 106b' in the present embodiment. That is, oxygen deficiency is confirmed in the tantalum oxide material layer 106b' and which indicates that the tantalum oxide material layer 106b' is of oxygen-deficient. When the composition of the tantalum oxide material layer 106b' is represented by $TaO_z$, the value of z is within a range of z<2.5. It should be noted that the tantalum oxide material layer 106b' may not be of the oxygen-deficient.

From the results described above, when the composition of the tantalum oxide material layer 106b' in the present embodiment is represented by $TaO_z$, the value of z is within a range of 2.42<z<2.5. In addition, the resistivity of the tantalum oxide material layer 106b' is equal to or greater than 50,000 mΩ cm.

[Effect in Inhibiting Deterioration of Oxygen Concentration Profile]

Figure 6:
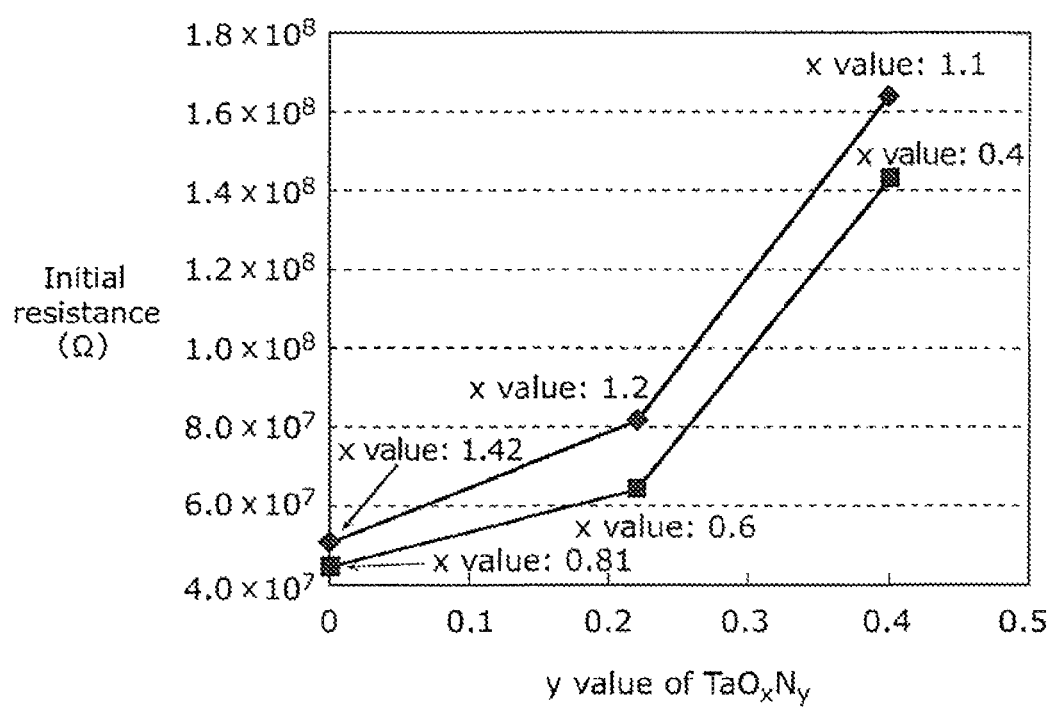
FIG. 6 is a diagram showing relationship between an initial resistance value of the nonvolatile memory element and values of x and y of the oxygen- and/or nitrogen-deficient tantalum oxynitride material layer having a composition represented by $TaO_xN_y$.

FIG. 6 is a diagram showing the relationship between the values of x and y of the oxygen- and/or nitrogen-deficient tantalum oxynitride material layer 106a' having the composition represented by $TaO_xN_y$ and an initial resistance value of the nonvolatile memory element. In FIG. 6, the initial resistance values are measured at the values of x and y changing in a range of 0.8≤x+y≤1.9, 0<y≤0.5. Specifically, the initial resistance values of the nonvolatile memory element 10 using the oxygen- and/or nitrogen-deficient tantalum oxynitride material layer 106a' when the value of y is 0, 0.22, and 0.4 and the value of x is 0.4 to 1.42 are shown. The value of x at a point of each initial resistance value shown in FIG. 6 is described in FIG. 6.

In the example shown in FIG. 6, the tantalum oxide layer 106b has a film thickness of 5.5 nm. Data denoted by solid black squares in the figure indicates initial resistance values when the resistivity of the oxygen- and/or nitrogen-deficient tantalum oxynitride layer 106a is 2 mΩ cm, and data denoted by solid diamond shapes indicates initial resistance values when the resistivity of the oxygen- and/or nitrogen-deficient tantalum oxynitride layer 106a is 4 mΩ cm. The resistivity of the tantalum oxide material layer 106b' is at least equal to or greater than 50,000 mΩ cm, and is 10,000 times as large as the resistivity (2 mΩ cm, 4 mΩ cm) of the oxygen- and/or nitrogen-deficient tantalum oxynitride material layer 106a', the resistivity (3 mΩ cm) of the first electrode material layer 105', and the resistivity (0.2 mΩ cm) of the second electrode material layer 107'. Due to this, the initial resistance value of the nonvolatile memory element 10 is substantially determined by a film thickness and oxygen content percentage (namely, the value of z) of the tantalum oxide layer 106b that has a largest resistivity.

The initial resistance value of the nonvolatile memory element 10 when the value of y is 0 which is indicated in FIG. 6 corresponds to the initial resistance value of a nonvolatile memory element 20 incorporating the variable resistance element 212 described in WO2008/149484. In the example shown in FIG. 6, a material making up a second tantalum oxide layer 206b in the variable resistance element 212 is the tantalum oxide material layer 106b' in the present embodiment, and a film thickness thereof is 5.5 nm. It should be noted that, even in the nonvolatile memory element 20, the initial resistance value is determined by the film thickness and oxygen content percentage of the second tantalum oxide material layer 206b for the same reason as for the nonvolatile memory element 10.

FIG. 6 indicates that the nonvolatile memory element 10 according to the present embodiment, employing the oxygen- and/or nitrogen-deficient tantalum oxynitride layer 106a, has a high initial resistance value as compared to the conventional nonvolatile memory element 20 described in WO2008/149484. That is, in the conventional nonvolatile memory element 20, due to the thermal budget given in the steps shown in (j) and (k) of FIG. 2, oxygen in the second tantalum oxide layer 206b is diffused to the first tantalum oxide layer 206a and the film thickness or oxygen content percentage of the second tantalum oxide layer 206b reduces. On the other hand, the nonvolatile memory element 10 according to the present embodiment has a high initial resistance value as compared to the conventional nonvolatile memory element 20. Thus, it can be determined that diffusion of oxygen from the tantalum oxide layer 106b to the oxygen- and/or nitrogen-deficient tantalum oxynitride material layer 106a' is inhibited, inhibiting the deterioration of the oxygen concentration profile of the tantalum oxide layer 106b.

Moreover, FIG. 6 indicates that as the value of y increases, the initial resistance value increases. It is considered that the reason why as nitrogen content (namely, the value of y) increases the initial resistance value increases is because the diffusion of oxygen is inhibited by the presence of nitrogen. In addition, the thickness of the oxygen- and/or nitrogen-deficient tantalum oxynitride material layer 106a' is greater than the thickness of the tantalum oxide material layer 106b', and thus it is considered that the diffusion of oxygen is further inhibited. Therefore, in the nonvolatile memory element 10 according to the present embodiment, because the variable resistance layer 106 has a two-layer structure including the oxygen- and/or nitrogen-deficient tantalum oxynitride material layer 106a' having an oxygen barrier characteristic and the tantalum oxide material layer 106b', it is considered that the variable resistance layer 106 stabilizes the resistance change characteristics of the variable resistance element 112.

It can be determined that effects in inhibiting the deterioration of the oxygen concentration profile of the tantalum oxide layer 106b can at least be obtained when y>0 is satisfied. Preferably, the value of y is greater than 0.22.

[Example of Resistance Change Operation]

Next, examples of the operation of the nonvolatile memory element 10 as memory, namely, an example of the operation of the nonvolatile memory element 10 in writing/reading information will be described.

The nonvolatile memory element 10 changes between the high resistance state and the low resistance state by having applied thereto two types of voltage pulses having different polarities. That is, when, based on a voltage of the first electrode layer 105, a negative voltage (voltage: −1.8 V, pulse width: 100 ns) is applied to the second electrode layer 107, the nonvolatile memory element 10 reduces from the high resistance state (resistance value; 46,000Ω to 150,000Ω) to the low resistance state (resistance value; about 10,000Ω). On the other hand, when a positive voltage (voltage: 2.4 V, pulse width: 100 ns) is applied to the second electrode layer 107, the nonvolatile memory element 10 increases from the low resistance state to the high resistance state.

Figure 7A:
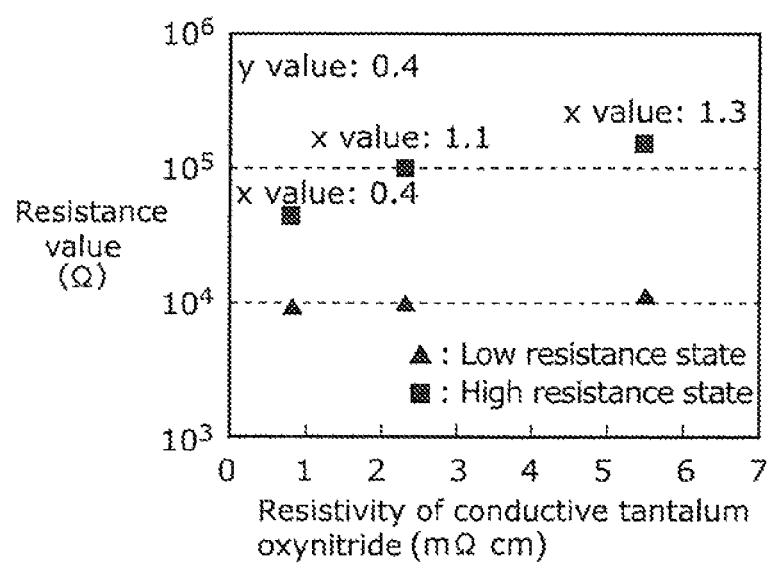
FIG. 7A is a diagram showing a resistance value of the nonvolatile memory element in a high resistance state and a low resistance state, indicating the resistance value of the nonvolatile memory element using the oxygen- and/or nitrogen-deficient tantalum oxynitride material layer having the value of y being 0.4 and the value of x being 0.4 to 1.3 in the high resistance state and the low resistance state.
Figure 7B:
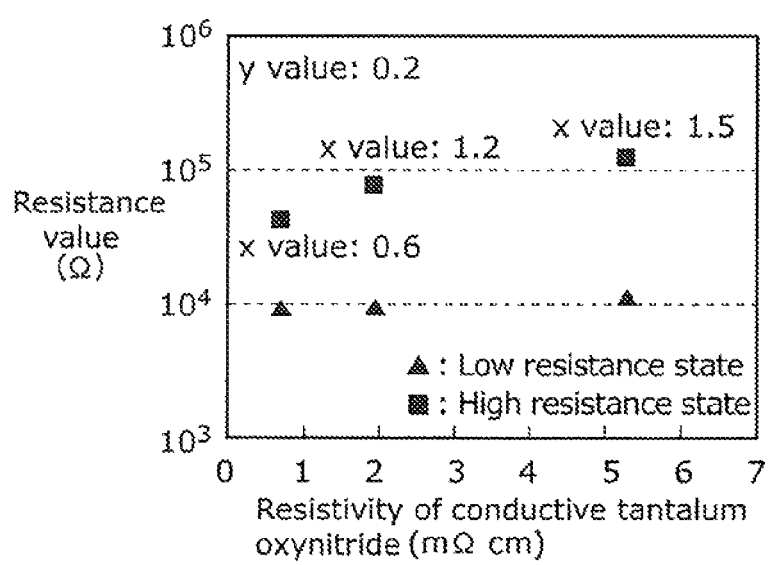
FIG. 7B is a diagram showing a resistance value of the nonvolatile memory element in the high resistance state and the low resistance state, indicating the resistance value of the nonvolatile memory element using the oxygen- and/or nitrogen-deficient tantalum oxynitride material layer having the value of y being 0.22 and the value of x being 0.6 to 1.5 in the high resistance state and the low resistance state.

FIG. 7A and FIG. 7B show resistance values in the high resistance state and the low resistance state when the resistance values are changed by applying voltage pulses having different polarities between the first electrode layer 105 and the second electrode layer 107 of the nonvolatile memory element 10.

FIG. 7A shows resistance values of the nonvolatile memory element 10 employing the oxygen- and/or nitrogen-deficient tantalum oxynitride material layer 106a', in the high resistance state and the low resistance state when the value of y is changed to 0.4 and the value of x is changed to 0.4, 1.1, and 1.3. In FIG. 7A, black solid square shapes and black solid triangle shapes denote resistance values in the high resistance state and the low resistance state, respectively, in each case where the resistivity of the oxygen- and/or nitrogen-deficient tantalum oxynitride material layer 106a' is 0.80 mΩ cm, 2.1 mΩ cm, and 5.8 mΩ cm. The value of x with respect to each resistivity is also shown in FIG. 7A. In all the cases where the value of x is 0.4, 1.1, and 1.3, the nonvolatile memory element 10 stably operates at a low voltage, indicating the high resistance state and the low resistance state.

Likewise, FIG. 7B shows resistance values of the nonvolatile memory element 10 employing the oxygen- and/or nitrogen-deficient tantalum oxynitride material layer 106a', in the high resistance state and the low resistance state when the value of y is changed to 0.22 and the value of x is changed to 0.6, 1.2, and 1.5. In FIG. 7B, black solid square shapes and black solid triangle shapes denote resistance values in the high resistance state and the low resistance state, respectively, in each case where the resistivity of the oxygen- and/or nitrogen-deficient tantalum oxynitride material layer 106a' is 0.76 mΩ cm, 1.9 mΩ cm, and 6.0 mΩ cm. The value of x with respect to each resistivity is also shown in FIG. 7B. In all the cases where the value of x is 0.6, 1.2, and 1.5, the nonvolatile memory element 10 stably operates at a low voltage, indicating the high resistance state and the low resistance state.

As described above, in the nonvolatile memory element 10, the resistance change operation at a voltage equal to or less than 2.4 V is possible, and, as compared to the nonvolatile memory element 30 employing the variable resistance element 312 described in WO2008/146461, the resistance change operation at a low voltage is possible. It can also be seen that the resistance change operation does not occur only when the oxygen- and/or nitrogen-deficient tantalum oxynitride layer 106a is formed under particular conditions, and the resistance change operation is possible when the resistivity is in a range of 0.75 mΩ cm to 6 mΩ cm.

Figure 8:
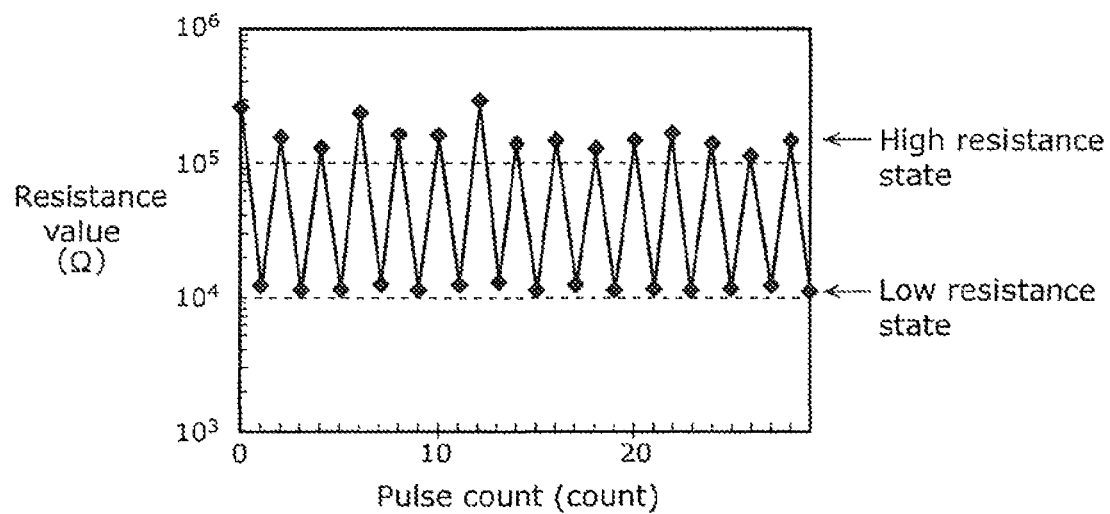
FIG. 8 is a diagram showing relationship between the number of pulses and the resistance value in rewriting data to the variable resistance element.

FIG. 8 is a diagram showing relationship between the number of pulses and resistance value in rewriting data to the variable resistance element. That is, FIG. 8 shows cycling characteristics in that rewriting is performed alternately repeating the high resistance state and the low resistance state for a plural number of times.

As shown in FIG. 8, when the writing is performed alternately repeating the high resistance state and the low resistance state in the variable resistance element 112, two values indicating the high resistance state and the low resistance state are consistently detected as the change of the resistance value. Thus, it can be seen that, as compared to the conventional technique shown in FIG. 17, the variable resistance element 112 shown in the present embodiment overcomes disadvantages that the resistance value in the high resistance state gradually reduces or the resistance value in the low resistance state varies.

Figure 9:
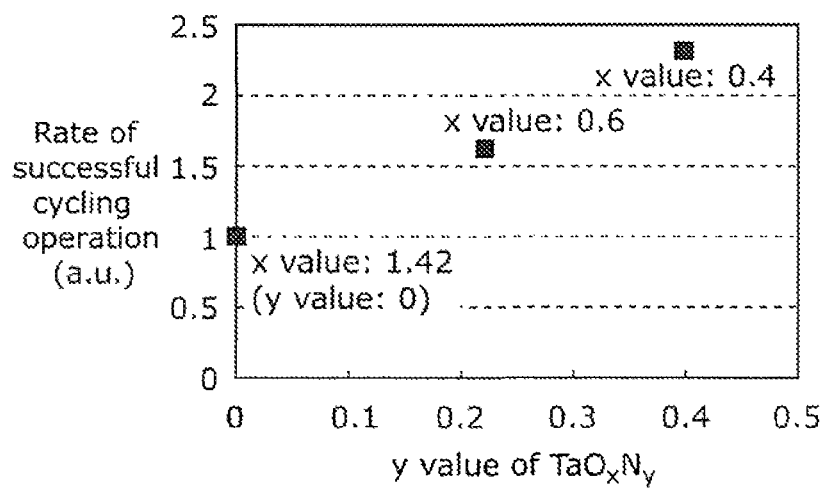
FIG. 9 is a diagram showing a rate of successful cycling operation and the value of y of the oxygen- and/or nitrogen-deficient tantalum oxynitride material layer having a composition represented by $TaO_xN_y$.

FIG. 9 is a diagram showing a rate of successful cycling operation and the value of y of the oxygen- and/or nitrogen-deficient tantalum oxynitride material layer 106a' having the composition represented by $TaO_xN_y$. That is, FIG. 9 shows cases where the high resistance state and the low resistance state in the above-described cycling operation indicate values within predetermined ranges (if successful) when changing the values of x and y of the oxygen- and/or nitrogen-deficient tantalum oxynitride material layer 106a' having the composition represented by $TaO_xN_y$.

As shown in FIG. 9, the rate of successful cycling operation is high when the value of y is high, namely, when the oxygen diffusion is inhibited. Therefore, it can be seen that, in the variable resistance element 112 according to the present embodiment, the operation of rewriting to the variable resistance element 112 is stabilized when oxygen deficient and/or nitrogen deficient are small.

Embodiment 2

Next, an embodiment 2 according to one embodiment of the present invention will be described. A nonvolatile memory element according to the present embodiment is different from the nonvolatile memory element according to the embodiment 1 in that the tantalum oxide layer is disposed on the oxygen- and/or nitrogen-deficient tantalum oxynitride layer in the variable resistance layer of the nonvolatile memory element according to the present embodiment.

[Structure of Nonvolatile Memory Element]

Figure 10:
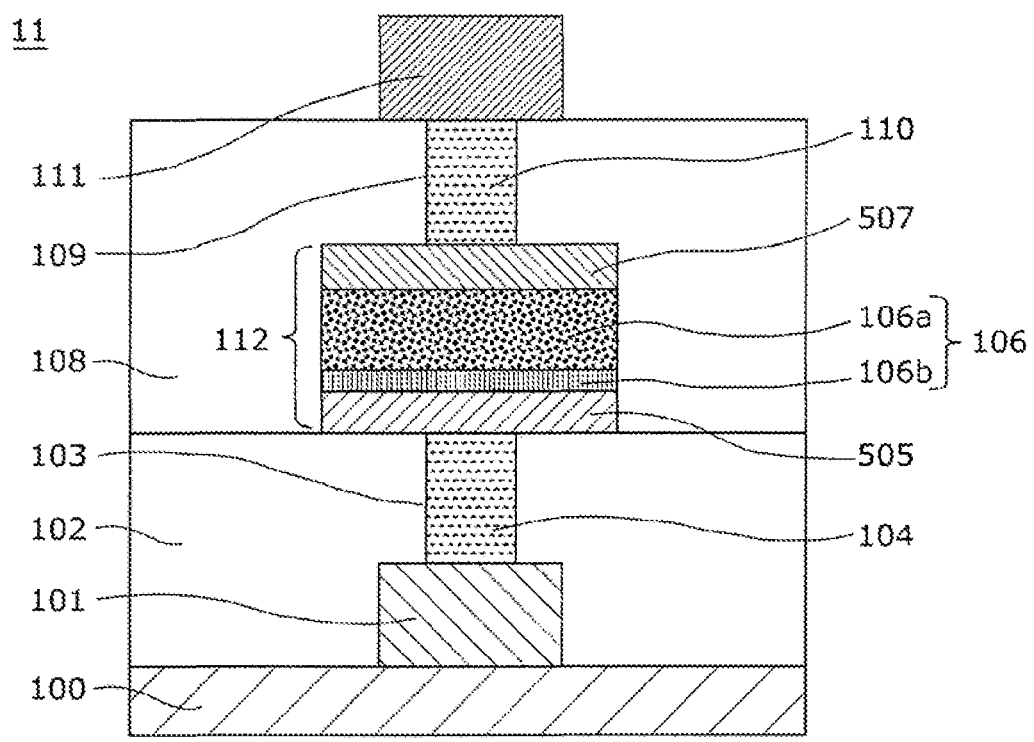
FIG. 10 is a cross-sectional view showing a schematic illustration of a nonvolatile memory element which is a modification of the nonvolatile memory element.

FIG. 10 shows a cross-sectional view of a nonvolatile memory element 11 which is a modification of the nonvolatile memory element 10 described in FIG. 1A. In FIG. 10, the same reference signs are given to the same components as those shown in FIG. 1A and the description thereof will be omitted. As shown in FIG. 10, the nonvolatile memory element 11 is different from the nonvolatile memory element 10 in that the components of the variable resistance layer 106 of the nonvolatile memory element 11 are disposed in a reversed order as compared to those of the nonvolatile memory element 10.

As shown in FIG. 10, the variable resistance element 112 includes a first electrode layer 505 (thickness: 5 nm to 100 nm) comprising a noble metal (such as Pt, Ir, and Pd) or the like so as to cover the first contact plug 104, the variable resistance layer 106 (thickness: 20 nm to 100 nm), and a second electrode layer 507 (thickness: 5 nm to 100 nm) comprising a tantalum nitride or the like.

Here, as shown in FIG. 10, the variable resistance layer 106 has a two-layer structure including the tantalum oxide layer 106b formed on the first electrode layer 505 and the oxygen- and/or nitrogen-deficient tantalum oxynitride layer 106a formed on the tantalum oxide layer 106b. Rest of the structure is similar to that of the nonvolatile memory element 10 shown in the embodiment 1.

[Method for Manufacturing Nonvolatile Memory Element]

Figure 11:
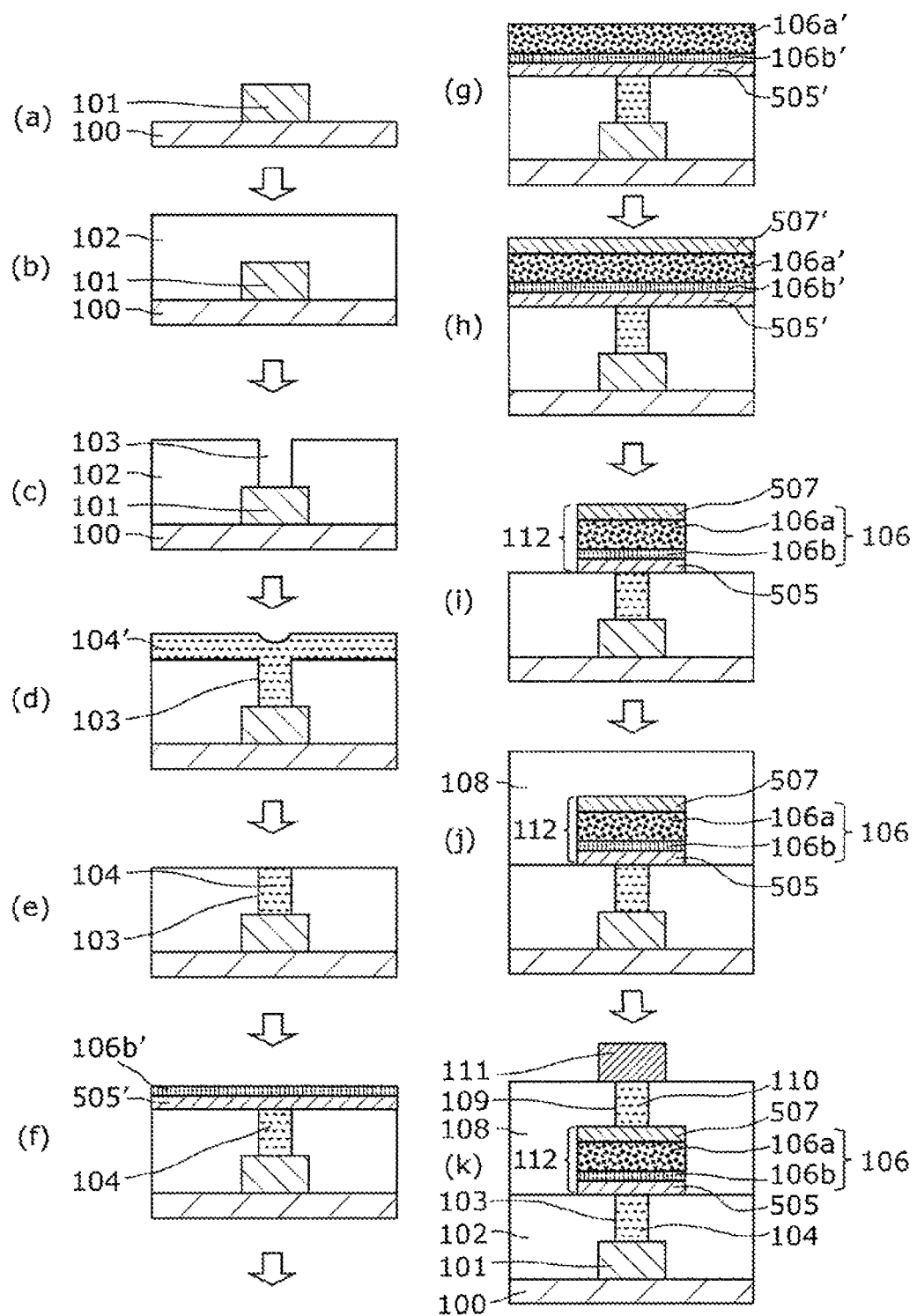
FIG. 11 is a cross-sectional view showing steps of a method for manufacturing a nonvolatile memory element according to an embodiment 2 of the present invention, wherein (a) is a diagram showing a step of forming the first line on the substrate, (b) is a diagram showing a step of forming the first interlayer insulating layer, (c) is a diagram showing a step of forming the first contact hole, (d) and (e) are diagrams showing a step of forming the first contact plug, (f) is a diagram showing a step of forming the first electrode material layer and a tantalum oxynitride material layer, (g) is a diagram showing a step of forming the oxygen- and/or nitrogen-deficient tantalum oxynitride material layer, (h) is a diagram showing a step of forming the second electrode material layer, (i) is a diagram showing a step of forming, by patterning using a mask and dry etching, a variable resistance element which includes the first electrode layer, the tantalum oxide layer, the oxygen- and/or nitrogen-deficient tantalum oxynitride layer, and the second electrode layer, (j) is a diagram showing a step of forming the second interlayer insulating layer, (k) is a diagram showing a step of forming the second contact hole, the second contact plug, and the second line.

Parts (a) to (k) of FIG. 11 show cross-sectional views illustrating a method for manufacturing the nonvolatile memory element 11 according to the present embodiment. Using the figures, a method for manufacturing important part of the nonvolatile memory element 11 will be described.

As shown in (a) of FIG. 11, the first line 101 is formed on the substrate 100. On the substrate 100 on which a transistor, an underlying line, and the like are formed, a conductive layer (thickness: 400 nm to 600 nm) comprising aluminum or the like is formed by the sputtering method or the like. The obtained conductive layer is processed by patterning using a mask having a desired line pattern and dry etching to form the first line 101. It should be noted that the first line 101 may be formed using a manufacturing method such as damascene.

Next, as shown in (b) of FIG. 11, the first interlayer insulating layer 102 is formed. A plasma TEOS as an insulating layer is formed on the substrate 100 by the CVD method so as to cover the first line 101, and thereafter a surface of the plasma TEOS is planarized to form the first interlayer insulating layer 102 (thickness: 500 nm to 1000 nm). While the plasma TEOS is used for the first interlayer insulating layer 102, for reduction of parasitic capacitance between lines, a fluorine-containing oxide (for example, FSG) or a low-k material may be used.

Next, as shown in (c) of FIG. 11, the first contact hole 103 is formed. The first contact hole 103 (diameter: 50 nm to 300 nm) extending through the first interlayer insulating layer 102 is formed by patterning using a mask having a desired contact hole pattern and dry etching. Here, if the first line 101 has a smaller width than the first contact hole 103, an area in contact between the first line 101 and the first contact plug 104 changes due to misalignment of the mask, causing a change in, for example, a cell current. To prevent this, the first line 101 has an outline having a width greater than the first contact hole 103.

Next, as shown in (d) of FIG. 11, the first contact plug 104 to be connected to the first line 101 is formed. First, titanium (Ti) layer/titanium nitride (TiN) layer (thickness: 5 nm to 30 nm, each) each functioning as an adhesion layer and a diffusion barrier are deposited as a bottom layer by the sputtering method and the CVD method, respectively, and tungsten (W) (thickness: 200 nm to 400 nm), which is the principal component of the first contact plug 104, is deposited as a top layer by the CVD method. The first contact hole 103 is filled with a conductive layer 104' which has a stacked structure and is to be the first contact plug 104. The conductive layer 104' has the above-described W/Ti/TiN structure.

Next, as shown in (e) of FIG. 11, the first contact plug 104 is formed. After the above-described conductive layer 104' is formed, the planarization polishing is performed on an entire wafer surface of the conductive layer 104' using the chemical mechanical polishing (CMP) to remove unnecessary portion of the conductive layer 104' on the first interlayer insulating layer 102, and the first contact plug 104 which has the conductive layer 104' left only inside the first contact hole 103 is formed.

Next, as shown in (f) of FIG. 11, in a step of forming a first electrode material layer 505' and the tantalum oxide material layer 106b', the first electrode material layer 505' (thickness: 20 nm to 50 nm) comprising iridium (Ir) is formed on the first interlayer insulating layer 102 by the sputtering method so as to cover the first contact plug 104. To achieve the resistance change operation of the variable resistance element 112 in a stable manner, it is desirable that the first electrode material layer 505', which is included in the tantalum oxide layer 106 and in contact with the tantalum oxide material layer 106b', comprises a noble metal.

Subsequently, the tantalum oxide material layer 106b' is formed on the first electrode material layer 505' by the sputtering method. For formation of the tantalum oxide material layer 106b', a tantalum oxide having the composition represented by $Ta_2O_5$ is used as a sputtering target and the RF magnetron sputtering method which uses argon (Ar) as the sputtering gas is employed. Sputtering conditions are, by way of example, that the RF power supply output is 200 W, the pressure of deposition is 0.3 Pa, the argon gas flow rate is 300 sccm, and the substrate temperature is room temperature. A thickness, of the tantalum oxide material layer 106b' stacked under the oxygen- and/or nitrogen-deficient tantalum oxynitride material layer 106a', that is effective to cause the resistance change can be measured using the spectroscopic ellipsometry, and the thickness is, by way of example, 3 nm to 10 nm.

Next, as shown in (g) of FIG. 11, in the step of forming the oxygen- and/or nitrogen-deficient tantalum oxynitride material layer 106a', the oxygen- and/or nitrogen-deficient tantalum oxynitride material layer 106a' is formed on the tantalum oxide material layer 106b'. For the formation of the oxygen- and/or nitrogen-deficient tantalum oxynitride material layer 106a', the reactive sputtering method is used in which a sputtering target comprising tantalum is sputtered in an atmosphere containing oxygen and nitrogen. The thickness of the oxygen- and/or nitrogen-deficient tantalum oxynitride material layer 106a' is measured using the spectroscopic ellipsometry, and the thickness is 20 nm to 50 nm. Sputtering conditions upon formation of the oxygen- and/or nitrogen-deficient tantalum oxynitride material layer 106a' by the reactive sputtering method are that the power supply output is 1,000 W, pressure of deposition is 0.05 Pa, argon, oxygen, and nitrogen are used as the sputtering gas, and flow rates of oxygen and nitrogen are controlled such that the resistivity of the oxygen- and/or nitrogen-deficient tantalum oxynitride material layer 106a' is 0.75 mΩ cm to 6 mΩ cm.

Next, as shown in (h) of FIG. 11, a second electrode material layer 507' is formed. A tantalum nitride (TaN) as the second electrode material layer 507' is formed on the oxygen- and/or nitrogen-deficient tantalum oxynitride material layer 106a' by the sputtering method.

Next, as shown in (i) of FIG. 11, in a step of forming the variable resistance element 112, the first electrode material layer 505', the tantalum oxide material layer 106b', the oxygen- and/or nitrogen-deficient tantalum oxynitride material layer 106a', and the second electrode material layer 507' are processed by patterning using a mask and dry etching to form the variable resistance element 112 which includes the first electrode layer 505, the tantalum oxide layer 106b, the oxygen- and/or nitrogen-deficient tantalum oxynitride layer 106a, and the second electrode layer 507.

Next, as shown in (j) of FIG. 11, the second interlayer insulating layer 108 (500 nm to 1,000 nm) is formed covering the variable resistance element 112. After the formation of the second interlayer insulating layer 108, for the purposes of relaxation of residual stress of the second interlayer insulating layer 108 and removal of residual water in the second interlayer insulating layer 108, the nonvolatile memory element 10 is heat treated for 10 minutes in a furnace heated at 400° C.

Last, as shown in (k) of FIG. 11, the second contact hole 109 and the second contact plug 110 are formed by the same manufacturing method as shown in (a) to (e) of FIG. 2. The second line 111 is thereafter formed covering the second contact plug 110. After the formation of the second line 111, for purposes of preventing corrosion of aluminum making up the second line 111, the nonvolatile memory element 11 is heat treated for 10 minutes in a furnace heated at 400° C. for the completion.

As described above, in the method for manufacturing the nonvolatile memory element 11 according to the present embodiment, the steps of (j) and (k) shown in FIG. 11 each include a step of heat treating the nonvolatile memory element 10 for 10 minutes in the furnace heated at 400° C. The heat treatment provides the variable resistance element 112 with a thermal budget.

The oxygen- and/or nitrogen-deficient tantalum oxynitride material layer 106a' is formed on the tantalum oxide material layer 106b' in the nonvolatile memory element 11 shown in the embodiment of the present invention. This provides a wide selection of methods for manufacturing the tantalum oxide layer 106b. In the nonvolatile memory element 10 in which the tantalum oxide layer 106b is disposed on the oxygen- and/or nitrogen-deficient tantalum oxynitride layer 106a, when, for example, the tantalum oxide material layer 106b' is formed by the reactive sputtering method in which oxygen is used for reaction gas, the oxygen- and/or nitrogen-deficient tantalum oxynitride material layer 106a' is exposed to an oxygen plasma atmosphere. This oxidizes the surface of the oxygen- and/or nitrogen-deficient tantalum oxynitride material layer 106a', preventing achievement of the variable resistance layer 106 that has a desired oxygen concentration profile. The oxygen- and/or nitrogen-deficient tantalum oxynitride material layer 106a' is not exposed to the oxygen plasma in the nonvolatile memory element 11. Thus, in the step of forming the tantalum oxide material layer 106b' which is shown in (f) of FIG. 11, the tantalum oxide material layer 106b' can be formed by a reactive sputtering method in which tantalum is the target and oxygen is used for reaction gas. The deposition rate of the tantalum oxide material layer 106b' formed by the reactive sputtering method is 6 nm/minute, which is about 5 times as fast as compared to the manufacturing method shown in (g) of FIG. 2 (deposition rate: 1.2 nm/minute). As described above, in the method for manufacturing the nonvolatile memory element 11, an increase in deposition rate is possible and the nonvolatile memory element 11 can be manufactured at a low cost as compared to the nonvolatile memory element 10.

Embodiment 3

Next, an embodiment 3 according to an embodiment of the present invention will be described. A nonvolatile memory element according to the present embodiment is different from the nonvolatile memory element according to the embodiment 1 in that the nonvolatile memory element of the embodiment 3 is a multi-layered stack of the nonvolatile memory element shown in the embodiment 1 and the embodiment 2.

Figure 12:
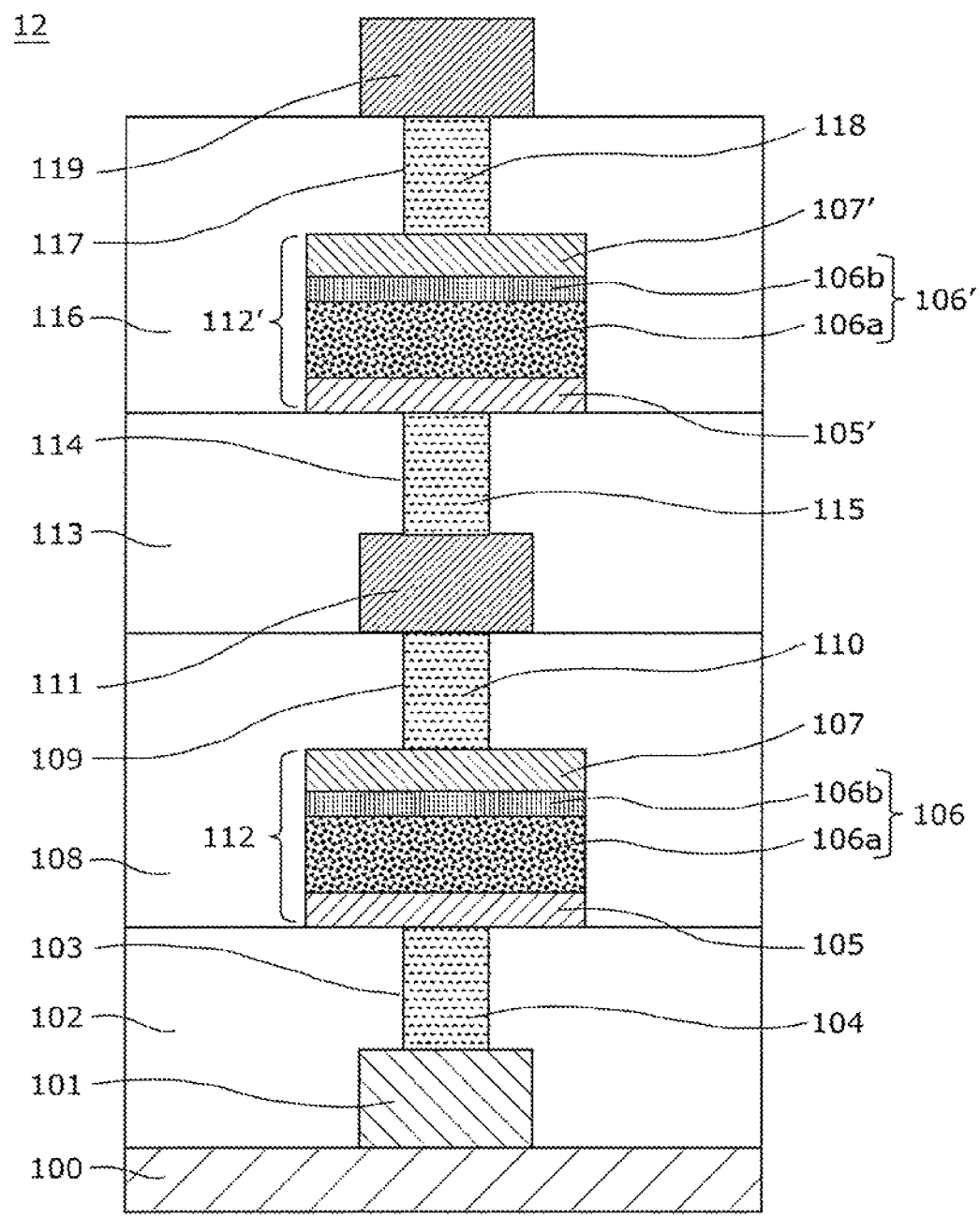
FIG. 12 is a cross-sectional view showing an example of a structure of a nonvolatile memory element according to an embodiment 3 of the present invention.

FIG. 12 is a cross-sectional view showing an example of a structure of a nonvolatile memory element 12 according to the embodiment 3 of the present invention. The example shown in FIG. 12 has a structure in which two layers of the nonvolatile memory element 10 shown in FIG. 1A are stacked, using the second line in a shared manner.

The nonvolatile memory element 12 shown in FIG. 12 includes, on the second interlayer insulating layer 108 of the nonvolatile memory element 10 shown in FIG. 1A, a third interlayer insulating layer 113, which comprises a silicon dioxide film or the like (500 nm to 1000 nm) and is formed covering the second line 111, a third contact hole 114 (diameter: 50 nm to 300 nm) formed extending through the third interlayer insulating layer 113, and a third contact plug 115 filled with tungsten as a principal component inside the third contact hole 114. The variable resistance element 112', which has the same structure as the variable resistance element 112, is formed on the third interlayer insulating layer 113 so as to cover the third contact plug 115.

The nonvolatile memory element 12 further includes a fourth interlayer insulating layer 116, which comprises a silicon dioxide film (thickness: 500 nm to 1000 nm) and is formed so as to cover the variable resistance element 112', a fourth contact hole 117 (diameter: 50 nm to 300 nm) formed extending through the fourth interlayer insulating layer 116, and a fourth contact plug 118 filled with tungsten as a principal component inside the fourth contact hole 117. Furthermore, a third line 119 is formed on the fourth interlayer insulating layer 116 so as to cover the fourth contact plug 118. The variable resistance layer 106' included in the variable resistance element 112' has a two-layer structure in which the oxygen- and/or nitrogen-deficient tantalum oxynitride layer 106a and the tantalum oxide layer 106b are stacked.

As the example shown in FIG. 12, if multi-layers of the nonvolatile memory element are stacked for a purpose of increasing the capacity per unit area, the underlying variable resistance element 112 and the overlying variable resistance element 112' have different amounts of thermal budgets given thereto. This is because heat treatment is provided in the steps of forming the third interlayer insulating layer 113, the fourth interlayer insulating layer 116, the third line 119, and the like.

The oxygen- and/or nitrogen-deficient tantalum oxynitride layer 106a included in the variable resistance layer 106 and the variable resistance layer 106' has an effect in inhibiting the diffusion of oxygen due to the thermal budget given thereto. Thus, in the nonvolatile memory element 12, even if amounts of given thermal budgets are different, inhibiting a difference between the oxygen concentration profile of the variable resistance layer 106 and the oxygen concentration profile of the variable resistance layer 106' is possible.

While the example of the structure of the nonvolatile memory element 12 shown in FIG. 12 shows the example in which two layers of the variable resistance element are stacked, two or more of the variable resistance elements may, of course, be stacked. Moreover, multi-layers of the nonvolatile memory element 11 shown in FIG. 10 may be stacked instead of multi-layers of the nonvolatile memory element 10 shown in FIG. 1A.

It should be noted that the present invention is not limited to the foregoing embodiments, and numerous other modifications and variations can be devised without departing from the scope of the invention.

For example, preferably, the electrode in contact with the tantalum oxide layer comprises one or more materials, each having higher a standard electrode potential than the standard electrode potential of tantalum, such as Au (gold), Pt (platinum), Ir (iridium), Pd (palladium), Cu (copper), Ag (silver), or the like. Moreover, preferably, the electrode not in contact with the tantalum oxide layer, namely, the electrode in contact with the oxygen- and/or nitrogen-deficient tantalum oxynitride layer comprises one or more materials, each having a lower standard electrode potential than the standard electrode potential of tantalum, such as W, Ni, and TaN. With such a structure, the resistance change operation in the variable resistance layer can be caused only at the interface between the tantalum oxide layer and the electrode contacting therewith, thereby achieving the stable resistance change operation.

Moreover, the structure of the nonvolatile memory element is not limited to the structure in which two layers of the nonvolatile memory element are stacked using the second line in the shared manner, and may be a structure in which three or more layers of the nonvolatile memory element are stacked.

Moreover, the structure of the nonvolatile memory element may be such that a plurality of the above-described nonvolatile memory elements is included and two-dimensionally disposed. Furthermore, the structure may be a multi-layer stack of the structure in which such plurality of nonvolatile memory elements is two-dimensionally disposed.

Moreover, various modifications to the present embodiments that may be conceived by those skilled in the art and other embodiments constructed by combining constituent elements in different embodiments are included in the scope of the present invention, without departing from the essence of the present invention. For example, memory systems such as ReRAM which includes the nonvolatile memory element according to the present invention are included in the scope of the present invention.

A nonvolatile memory element and a method for manufacturing the nonvolatile memory element according to the present invention has effects in inhibiting the deterioration of an oxygen concentration profile of a variable resistance layer due to a thermal budget. The nonvolatile memory element and the method for manufacturing the nonvolatile memory element according to the present invention also have effects which allows the nonvolatile memory element to operate at a low voltage, and are thus effective as a nonvolatile memory element, such as ReRAM which employs a variable resistance element.

The invention claimed is:

1. A nonvolatile memory element comprising:
   a first electrode layer formed above a substrate;
   a variable resistance layer disposed directly on said first electrode layer; and
   a second electrode layer disposed directly on said variable resistance layer,
   wherein said variable resistance layer:
   consists of a two-layer structure in which an oxygen- and/or nitrogen-deficient tantalum oxynitride layer and a tantalum oxide layer are stacked;
   changes to a low resistance state due to oxygen ions moving from said tantalum oxide layer to said oxygen- and/or nitrogen-deficient tantalum oxynitride layer; and
   changes to a high resistance state due to the oxygen ions moving from said oxygen- and/or nitrogen-deficient tantalum oxynitride layer to said tantalum oxide layer;
   wherein a thickness of said oxygen- and/or nitrogen-deficient tantalum oxynitride layer is greater than a thickness of said tantalum oxide layer;
   wherein, when a composition of said oxygen- and/or nitrogen-deficient tantalum oxynitride layer is represented by $TaO_xN_y$, x and y satisfy:
   $0.8 \leq x+y \leq 1.9$ and
   $0 < y \leq 0.5$
   and
   wherein, when a composition of said tantalum oxide layer is represented by $TaO_z$, z satisfies:
   $x+y<z$.

2. The nonvolatile memory element according to claim 1, wherein said oxygen- and/or nitrogen-deficient tantalum oxynitride layer has electrical conductivity.

3. The nonvolatile memory element according to claim 1, wherein an electrode in contact with said tantalum oxide layer comprises one or more materials, each having a standard electrode potential higher than a standard electrode potential of tantalum.

4. The nonvolatile memory element according to claim 3, wherein the electrode in contact with said tantalum oxide layer comprises one or more materials from among Au, Pt, Ir, Pd, Cu, and Ag.

5. The nonvolatile memory element according to claim 1, wherein an electrode in contact with said oxygen- and/or nitrogen-deficient tantalum oxynitride layer comprises one or more materials, each having a standard electrode potential lower than a standard electrode potential of tantalum.

6. The nonvolatile memory element according to claim 5, wherein the electrode in contact with said oxygen- and/or nitrogen-deficient tantalum oxynitride layer comprises one or more materials from among W, Ni, and TaN.

7. The nonvolatile memory element according to claim 1, wherein said variable resistance layer has a thickness of 20 nm to 100 nm.

* * * * *